US012614602B2

(12) United States Patent
Huang et al.

(10) Patent No.: US 12,614,602 B2
(45) Date of Patent: Apr. 28, 2026

(54) COUNTING CIRCUIT, SEMICONDUCTOR MEMORY, AND COUNTING METHOD

(71) Applicant: CXMT CORPORATION, Hefei (CN)

(72) Inventors: Zequn Huang, Hefei (CN); Kai Sun, Hefei (CN)

(73) Assignee: CXMT CORPORATION, Hefei (CN)

( * ) Notice: Subject to any disclaimer, the term of this patent is extended or adjusted under 35 U.S.C. 154(b) by 6 days.

(21) Appl. No.: 18/749,644

(22) Filed: Jun. 21, 2024

(65) Prior Publication Data

US 2024/0347124 A1 Oct. 17, 2024

Related U.S. Application Data

(63) Continuation of application No. PCT/CN2022/124052, filed on Oct. 9, 2022.

(30) Foreign Application Priority Data

Sep. 20, 2022 (CN) .......................... 202211141024.X

(51) Int. Cl.
G11C 29/44 (2006.01)

(52) U.S. Cl.
CPC ..................................... G11C 29/44 (2013.01)

(58) Field of Classification Search
CPC ............ G11C 29/44; G11C 2029/0409; G11C 2029/0411; G11C 29/42; G11C 29/52; G11C 11/4078
See application file for complete search history.

(56) References Cited

U.S. PATENT DOCUMENTS 5,663,991 A * 9/1997 Kelkar .................... G06F 11/27
714/E11.169
2006/0008083 A1 * 1/2006 Saito ......................... G06F 7/58
380/28
2024/0339146 A1 * 10/2024 Kim .................. G11C 11/40611

FOREIGN PATENT DOCUMENTS

CN 112783686 A 5/2021

* cited by examiner

*Primary Examiner* — Thien Nguyen
(74) *Attorney, Agent, or Firm* — Kilpatrick Townsend & Stockton LLP

(57) ABSTRACT

A counting circuit, a semiconductor memory, and a counting method are provided. The counting circuit includes a first decoding module and a first counting module, and the first decoding module is connected with the first counting module. The first decoding module is configured to receive a first mode signal, and decode the first mode signal to generate a decoded signal; and the first counting module includes at least one counting sub-module, and is configured to: determine, according to the decoded signal, a selected target counting module from the at least one counting sub-module, receive the counting signal, count the counting signal through the target counting module, and output a first counting pulse signal every time when a counting value corresponding to the counting signals reaches an integer multiple of a counting threshold.

19 Claims, 12 Drawing Sheets

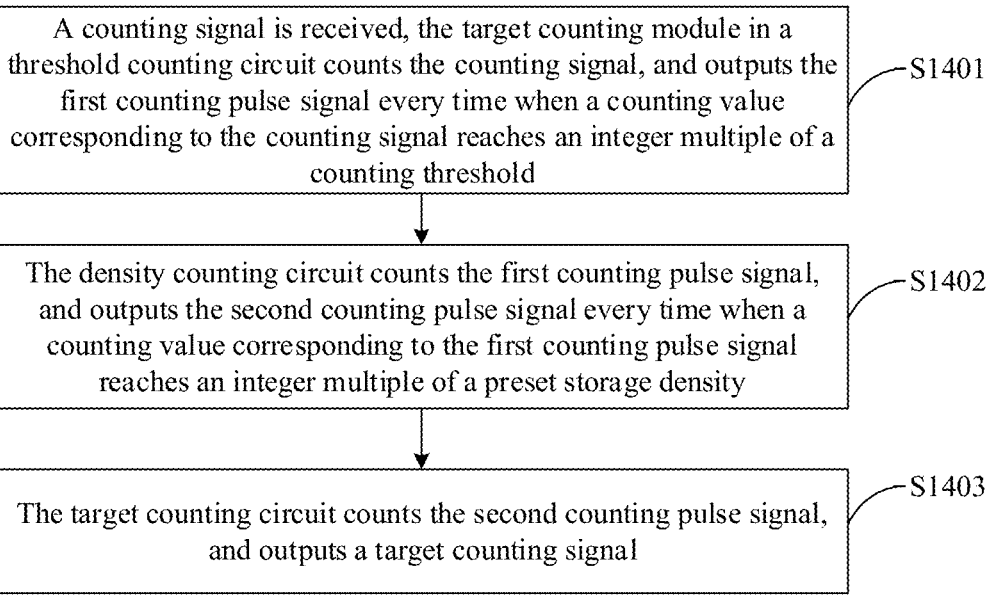

A counting signal is received, the target counting module in a threshold counting circuit counts the counting signal, and outputs the first counting pulse signal every time when a counting value corresponding to the counting signal reaches an integer multiple of a counting threshold     S1401

The density counting circuit counts the first counting pulse signal, and outputs the second counting pulse signal every time when a counting value corresponding to the first counting pulse signal reaches an integer multiple of a preset storage density     S1402

The target counting circuit counts the second counting pulse signal, and outputs a target counting signal     S1403

FIG. 16

COUNTING CIRCUIT, SEMICONDUCTOR MEMORY, AND COUNTING METHOD

CROSS-REFERENCE TO RELATED APPLICATION

The present disclosure is a continuation of International Application No. PCT/CN2022/124052 filed on Oct. 9, 2022, which is based upon and claims priority to Chinese Patent Application No. 202211141024.X filed on Sep. 20, 2022 and entitled "COUNTING CIRCUIT, SEMICONDUCTOR MEMORY, AND COUNTING METHOD", the disclosure of which is hereby incorporated by reference in their entireties.

BACKGROUND

With the continuous development of a semiconductor technology, when devices such as computers are manufactured and used by people, higher and higher requirements are proposed for the transmission speed of data. In order to obtain a faster data transmission speed, a series of devices, such as memories, upon which the data may be transmitted at Double Data Rate (DDR) have emerged.

Taking a Dynamic Random Access Memory (DRAM) as an example, it is required to perform complete Error Check and Scrub (ECS) on the DRAM once at least every 24 hours, and record the number of errors. However, an Error Counter (EC) in the related art has many connecting wires and logic devices, resulting in large circuit areas and high complexity for implementation.

SUMMARY

Embodiments of the present disclosure provide a counting circuit, a semiconductor memory, and a counting method.

In a first aspect, an embodiment of the present disclosure provides a counting circuit, which includes a first decoding module and a first counting module, and the first decoding module is connected with the first counting module. The first decoding module is configured to receive a first mode signal, and decode the first mode signal to generate a decoded signal. The first counting module includes at least one counting sub-module, and is configured to: determine, according to the decoded signal, a selected target counting module from the at least one counting sub-module, receive a counting signal, count the counting signal through the target counting module, and output a first counting pulse signal every time when a counting value corresponding to the counting signal reaches an integer multiple of a counting threshold.

In a second aspect, an embodiment of the present disclosure provides a semiconductor memory, which includes a threshold counting circuit, a storage density counting circuit and a target counting circuit. The threshold counting circuit is the counting circuit described in the first aspect. The threshold counting circuit is configured to receive the counting signal, count the counting signal through an internal target counting module, and output first counting pulse signals every time when a counting value corresponding to the counting signal reaches an integer multiple of a counting threshold. The storage density counting circuit is configured to count the first counting pulse signal, and output second counting pulse signal every time when a counting value corresponding to the first counting pulse signal reaches an integer multiple of a preset storage density. The target counting circuit is configured to count the second counting pulse signal, and output a target counting signal.

In a third aspect, an embodiment of the present disclosure provides a counting method, which is applied to the semiconductor memory described in the second aspect. The method includes the following operations. A counting signal is received, the target counting module in a threshold counting circuit counts the counting signal, and outputs the first counting pulse signal every time when a counting value corresponding to the counting signal reaches an integer multiple of a counting threshold. The density counting circuit counts the first counting pulse signal, and outputs the second counting pulse signal every time when a counting value corresponding to the first counting pulse signal reaches an integer multiple of a preset storage density. The target counting circuit counts the second counting pulse signal, and outputs a target counting signal.

BRIEF DESCRIPTION OF THE DRAWINGS

FIG. 16 is a schematic flowchart of a counting method according to an embodiment of the present disclosure.

DETAILED DESCRIPTION

Figure 1:
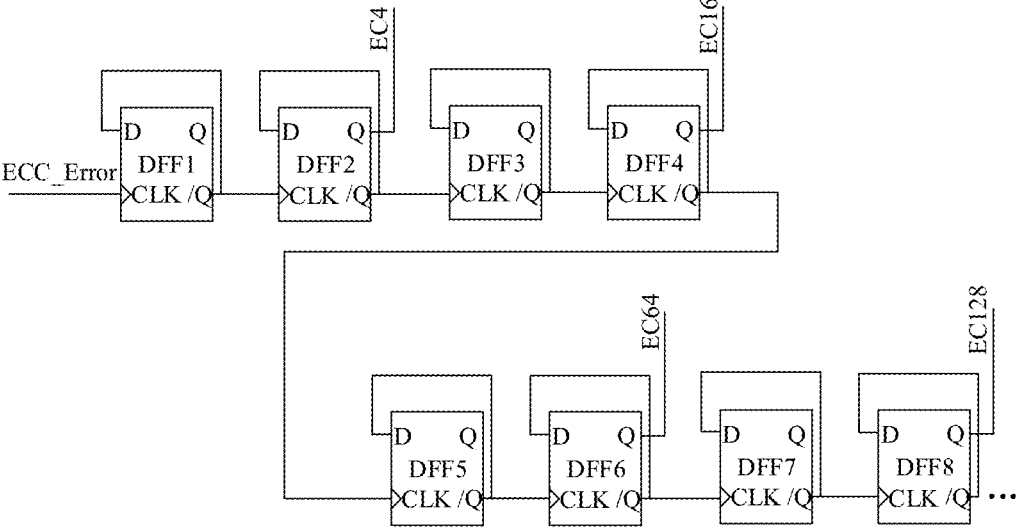
FIG. 1 is a schematic diagram of a composition structure of an EC.

The technical solutions in the embodiments of the present disclosure will be clearly and completely described below with reference to the accompanying drawings in the embodiments of the present disclosure. It is to be understood that the specific embodiments described here are merely used for explaining related disclosures rather than limiting the disclosure. In addition, it is to be further noted that, for ease of description, only the parts related to the disclosure are shown in the accompanying drawings.

Unless otherwise defined, all technical and scientific terms in the specification have the same meaning as those skilled in the art, belonging to the present disclosure, usually understand. Terms used herein are only used for describing the purpose of the present disclosure, but not intended to limit the present disclosure.

"Some embodiments" involved in the following descriptions describes a subset of all possible embodiments. However, it is to be understood that "some embodiments" may be the same subset or different subsets of all the possible embodiments, and may be combined without conflicts.

It is to be noted that, term "first/second/third" involved in the embodiments of the disclosure is merely for distinguishing similar objects and does not represent a specific sequence of the objects. It is to be understood that "first/second/third" may be interchanged to preset sequences or orders if allowed to implement the embodiments of the disclosure described herein in sequences except the illustrated or described ones.

Before the embodiments of the disclosure are further described in detail, the nouns and terms involved in the embodiments of the disclosure are described, and the nouns and terms involved in the embodiments of the disclosure are suitable for the following explanations.

Dynamic Random Access Memory (DRAM)
Synchronous Dynamic Random Access Memory (SDRAM)
Double Data Rate (DDR)
DDR5 Specification (DDR5 SPEC)
Reserved for Future Usage (RFU)
Multi-Purpose Command (MPC)
Multiplexer (MUX)
Mode Register (MR)
Mode Register Set (MRS)
Error Check and Scrub (ECS)

using an MPC sent by a memory controller; in the automatic ECS operation mode, the ESC command signal may be generated through refresh or self-refresh. The ESC command signal is configured to execute an ESC operation. Herein, at least one complete ESC operation needs to be performed on a DRAM within 24 hours.

It is to be understood that, taking a DDR5 DRAM as an example, an EC selects a mode through a MR14 OP[5]. When OP[5]=0, it indicates that a row counting mode (by default) is selected, and the row counting mode is used for counting how many rows have at least one error; and when OP[5]=1, it indicates that a codeword counting mode is selected, and the codeword counting mode is used for counting how many codeword errors there are. When the ECS operation is all completed for one time, the EC result is loaded to the MR according to a threshold filter; and the EC result will be reset after being transferred to the MR. Herein, the threshold filter is configured to cover error counts that are less than a threshold set by the threshold filter; and specifically the setting may be performed by using an MR15 OP[2:0], and a default setting is 256/memory unit, where OP[2:0]=011B. After all the ECS operation is executed, the result finally recorded by the EC is loaded in an MR20, and an error counting result EC[7:0] corresponding to the MR20 OP[7:0] represents the error count within a certain preset counting range. For example, if the minimum value of an error counting result EC[0] is greater than an Error Threshold Count (ETC) set by the threshold filter, and the maximum value of the EC[0] is less than or equal to $(2*ETC*storage$ density (in Gb)$-1)$, the value of the EC[0] is 1. Herein, the minimum value of the EC[7:1] is defined as EC[ ]min$=ETC*Density*2^{\wedge}$, and the maximum value of the EC[7:1] is defined as EC[ ]max$=2*(ETC*Density*2^{\wedge})-1$. That is, if the value of the EC[7:0] meets the corresponding preset counting range, a bit corresponding to the MR20 OP[7:0] is set to 1, otherwise, is set to 0, where =0, 1, 2, . . . , 7.

Exemplarily, Table 1 illustrates the ETC corresponding to each memory unit (Gb) set by the MR15, schematically. The ETC may be set to 256 by default.

TABLE 1

| OP[7] | OP[6] | OP[5] | OP[4] | OP[3] | OP[2] | OP[1] | OP[0] |
|---|---|---|---|---|---|---|---|
| | Unused bits (RFU) | | | Automatic ECS in Self-Refresh | OP[2:0]:000B = 4 OP[2:0]:001B = 16 OP[2:0]:010B = 64 OP[2:0]:011B = 256 (default) OP[2:0]:100B = 1024 OP[2:0]:101B = 4096 OP[2:0]:110B = RFU OP[2:0]:111B = RFU | | |

Error Checking and Correcting (ECC)

In the embodiments of the present disclosure, an ECS mode may be divided into an automatic ECS operation mode and a manual ECS operation mode. In the manual ECS operation mode, an ESC command signal is generated by Table 2 illustrates storage of a codeword value or a row value corresponding to each DRAM Die in the MR20, schematically.

TABLE 2

| | OP[7] | OP[6] | OP[5] | OP[4] | OP[3] | OP[2] | OP[1] | OP[0] |
|---|---|---|---|---|---|---|---|---|
| MR20 | EC7 | EC6 | EC5 | EC4 | EC3 | EC2 | EC1 | EC0 |

Taking the codeword counting mode as an example, the EC may be configured to count how many error codewords there are. FIG. 1 is a schematic diagram of a composition structure of an EC. In FIG. 1, an ECC_Error signal indicates a pulse signal generated when error codeword information is detected; and the EC is incremented each time when an ECC error is read. After the DRAM completes a complete ECS operation, a final error counting result selects the ETC and a preset storage density (nGb) according to Code<N:0> decoded by the MR15, and then the value meeting the current counting standard is loaded in the MR20.

Figure 2:
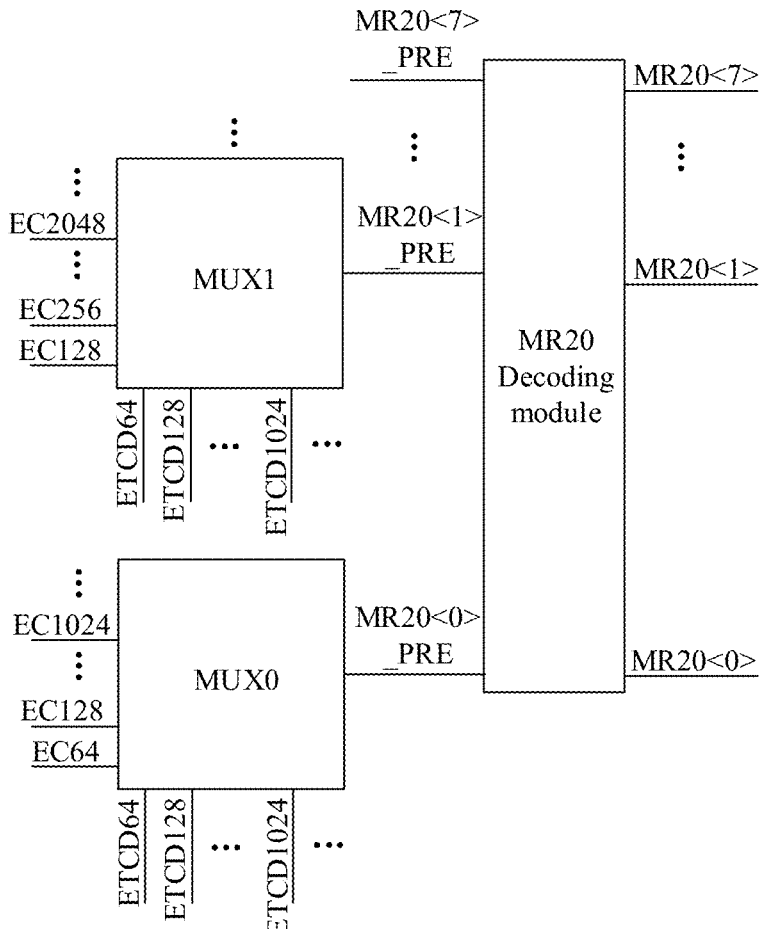
FIG. 2 is a schematic structural diagram of a logic circuit of an EC.

According to the Code<N:0> decoded by the MR15, the current ETC may be determined, and a threshold ETCD to be set can be obtained by multiplying by the preset storage density (nGb) of a chip. Taking ETCD=64 as an example, in this case, a value that needs to be selected to be connected with the lowest bit MR20[0] in the MR20 should be EC64; however, if ETCD=128, the value that needs to be selected to be connected with the lowest bit MR20[0] in the MR20 should be EC128, and likewise, other MR20[1:7] is selected in the same multiplication. In such designed EC, connecting wires and logic circuits with a great many of EC*signals and ETCD*signals are showed (herein, "*" may represent 64, 128, . . . , 1024, 2048, etc.), and details are shown in FIG. 2. In FIG. 2, herein, in addition to an MR20 decoding module, many logic devices (such as MUX0, MUX1, . . . , MUX7, etc.) are also needed. In addition, there are many interfaces around each logic device, and are respectively connected with many signals such as EC64, EC128, . . . , EC1024, . . . , ETCD64, ETCD128, . . . , ETCD1024, etc. Such counting method has many circuits and connecting wires, resulting in increased circuit areas and high complexity. Therefore, how to better design a counting circuit is the problem to be solved in the present disclosure.

Embodiments of the present disclosure are described in detail below with reference to the drawings.

Figure 3:
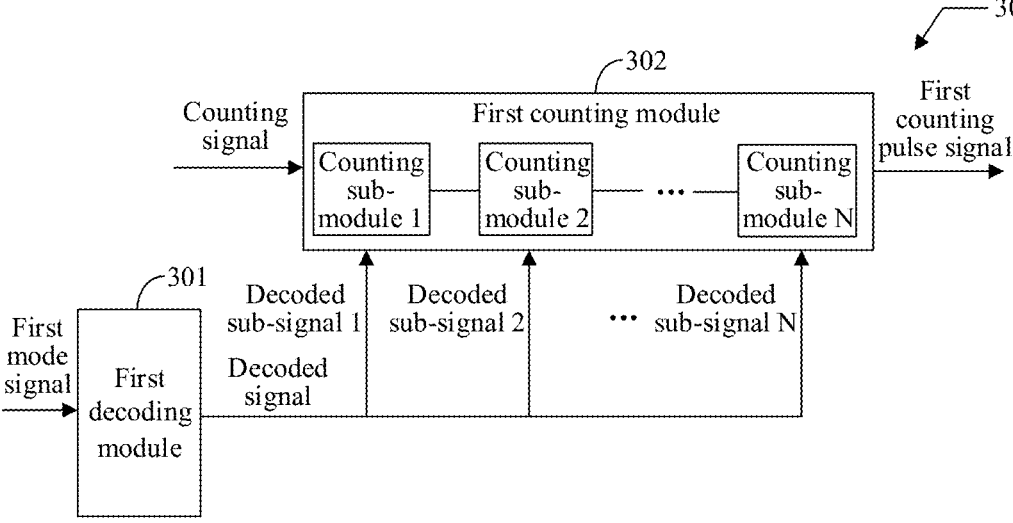
FIG. 3 is a first schematic diagram of a composition structure of a counting circuit according to an embodiment of the present disclosure.

In an embodiment of the present disclosure, FIG. 3 is a schematic diagram of a composition structure of a counting circuit 30 according to an embodiment of the present disclosure. As shown in FIG. 3, the counting circuit 30 may include a first decoding module (which may be, for example, implemented as a first decoding circuit) 301 and a first counting module (which may be, for example, implemented as a first counting circuit) 302, and the first decoding module 301 is connected with the first counting module 302.

The first decoding module 301 is configured to receive a first mode signal, and decode the first mode signal to generate a decoded signal.

The first counting module 302 includes at least one counting sub-module (which may be, for example, implemented as counting sub-circuit), and is configured to: determine, according to the decoded signal, a selected target counting module from the at least one counting sub-module, receive a counting signal, count the counting signal through the target counting module, and output a first counting pulse signal every time when a counting value corresponding to the counting signal reaches an integer multiple of a counting threshold.

It is to be noted that, in the embodiment of the present disclosure, the counting circuit 30 may be applied to a semiconductor memory, and may specifically be applied to a DRAM DDRR chip. More specifically, the counting circuit 30 may be applied to related circuits executing error counting in the ECS operation, but is not limited thereto, herein, may also be applicable to other circuits that count and record results.

It is further to be noted that, in the embodiment of the present disclosure, the first counting pulse signal represents a multiple relationship between the counting value corresponding to the counting signal and the counting threshold. Exemplarily, for example, the counting threshold is set to 4, when the counting signal accumulates 4 pulses, the output first counting pulse signal includes 1 pulse; and when the counting signal accumulates 8 pulses, the output first counting pulse signal includes 2 pulses. That is to say, at the 4th, 8th, 12th, 16th, . . . pulse of the counting signal, one pulse occurs correspondingly to the first counting pulse signal. In brief, the first counting pulse signal represents how many times that the counting value corresponding to the counting signal is equal to the counting threshold.

It is further to be noted that, in the embodiment of the present disclosure, the first mode signal may represent the counting threshold. Specifically, for error counting during the ECS operation, the counting threshold here may also be referred to as the ETC. Taking the foregoing Table 1 as an example, the first mode signal may be denoted by MR15 OP[2:0]. If the first mode signal is 000, the counting threshold may be 4; if the first mode signal is 001, the counting threshold may be 16; and if the first mode signal is 011, the counting threshold may be 256, etc. That is to say, different first mode signals may correspond to different counting thresholds.

In this way, after the first mode signal is decoded by the first decoding module 301, the decoded signal may be obtained. The corresponding target counting module can be selected from the first counting module 302 according to the decoded signal. Therefore, since different first mode signals correspond to different counting thresholds, and different decoded signals are obtained by decoding different first mode signals, different decoded signals may represent different counting threshold levels, and the target counting module can also be adaptively selected according to different decoded signals, such that counting statistics for different counting threshold levels can be met.

In the embodiment of the present disclosure, specifically referring to FIG. 3, the first decoding module 301 receives the first mode signal, and decodes the first mode signal to generate the decoded signal. The decoded signal may include N-bits decoded sub-signals, for example, a decoded sub-signal 1, a decoded sub-signal 2, . . . , a decoded sub-signal N in FIG. 3. The first counting module 302 includes at least one counting sub-module. The number of the at least one counting sub-module is also N, such as a counting sub-module 1, a counting sub-module 2, . . . , a counting sub-module N shown in FIG. 3. The at least one counting sub-module is cascaded, where N is an integer greater than 0.

Further, in this embodiment of the present disclosure, neither the decoded signal nor the first mode signal represents one signal; the decoded signal and the first mode signal here are both multi-bits signals; and there is an association relationship between the number of bits of the decoded signal and the number of bits of the first mode signal. In some embodiments, the number of bits of the decoded signal is $2^x$, where x represents the number of bits of the first mode signal.

It is to be noted that, the decoded signal may be a multi-bits decoded sub-signal. Here, the number of the decoded sub-signals is equal to the number of bits of the decoded signal, and also equal to the number of the counting sub-modules. Each decoded sub-signal is connected with the corresponding counting sub-module.

Exemplarily, assuming that the first mode signal includes three bits, the decoded signal may include eight bits, that is, the decoded signal may include eight bits of decoded sub-signals. Therefore, in the embodiment of the present disclosure, the first decoding module 301 may also be referred to as a 3-8 decoder.

In some embodiments, the decoded signal may include N-bits decoded sub-signals, where N is an integer greater than 0.

The first decoding module 301 is further configured to, during the generation of the decoded signal, in response to that a level value of an i-th-bit decoded sub-signal is a first value, determine that level values of the decoded sub-signals other than the i-th-bit decoded sub-signal are all a second value. The first value is different from the second value, and i is an integer greater than 0 and less than or equal to N.

It is to be noted that, in this embodiment of the present disclosure, the value of i is associated with the counting threshold. A level value of only one of the N-bits decoded sub-signals is the first value, such that the decoded signal is changed according to a position change of that decoded sub-signal (i.e., a value change of i). Different decoded signals correspond to different counting thresholds. In brief, different values of i correspond to different decoded signals, and different decoded signals represent different counting thresholds.

It is further to be noted that, in the embodiment of the present disclosure, the first value may be Logic 1 indicating a high level, and the second value may be Logic 0 indicating a low level; or the first value may be Logic 0 indicating the low level, and the second value may be Logic 1 indicating the high level. No limitations are constituted thereto.

Exemplarily, assuming that the first value is set to Logic 1, and the second value is set to Logic 0, for example, the decoded signal includes eight bits of decoded sub-signals, the decoded signal may be 0000 0001, 0000 0010, 0000 0100, or 0000 1000, or may be 0001 0000, 0010 0000, 0100 0000, or 1000 0000, etc. In combination with the foregoing Table 1, if the first mode signal is 000, and the corresponding decoded signal is 0000 0001, at this case, the counting threshold may be 4. If the first mode signal is 001, and the corresponding decoded signal is 0000 0010, at this case, the counting threshold may be 16 If the first mode signal is 010, and the corresponding decoded signal is 0000 0100, at this case, the counting threshold may be 64. If the first mode signal is 011, and the corresponding decoded signal is 0000 1000, at this case, the counting threshold may be 256, and so on. That is to say, different first mode signals may correspond to different decoded signals. In addition, in these different decoded signals, the level value of only one decoded sub-signal in each decoded signal is equal to 1; and the positions where the level value is equal to 1 being different may correspond to different decoded signals, and different decoded signals may also represent different counting thresholds.

In some embodiments, in the first counting module 302, the number of the at least one counting sub-module is N, and there is a correspondence relationship between an i-th counting sub-module and the i-th-bit decoded sub-signal.

The first counting module 302 is configured to: when the level value of the i-th-bit decoded sub-signal is the first value, determine that the i-th counting sub-module to an Nth counting sub-module are the target counting modules; and count the counting signal through the i-th counting sub-module to the Nth counting sub-module, and output the first counting pulse signal.

It is to be noted that, in the embodiment of the present disclosure, the N counting sub-modules are cascaded, and each counting sub-module is connected with the corresponding decoded sub-signal. In this way, when the level value of the i-th-bit decoded sub-signal is the first value, in this case, the counting signal is used as a clock input of the i-th counting sub-module, and the i-th counting sub-module and the counting sub-modules after the i-th counting sub-module (i.e., the i-th counting sub-module to the Nth counting sub-module) are used as the target counting modules. That is to say, the counting signal is counted according to the i-th counting sub-module and the counting sub-modules after the i-th counting sub-module.

Figure 4:
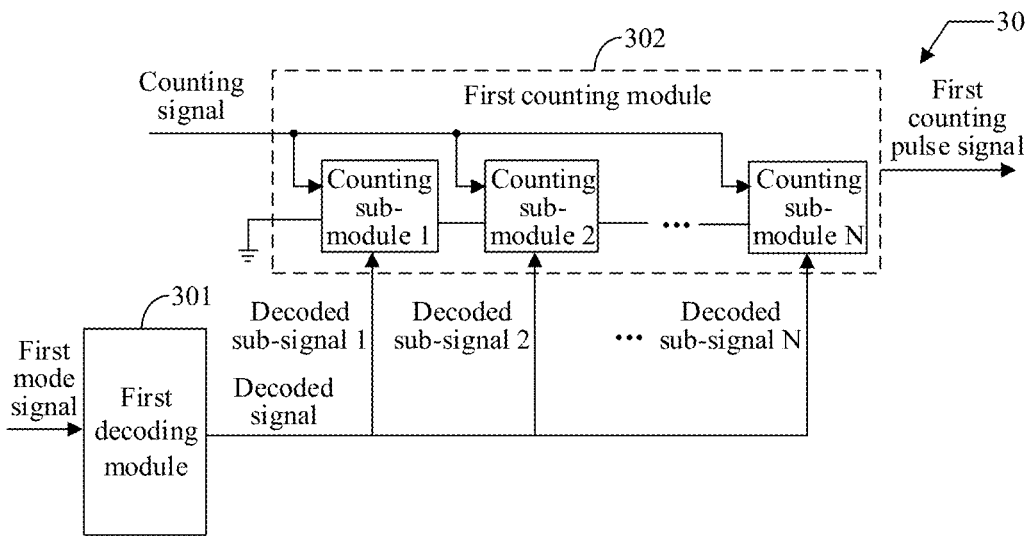
FIG. 4 is a second schematic diagram of a composition structure of a counting circuit according to an embodiment of the present disclosure.

For the first counting module 302, referring to FIG. 4, the N counting sub-modules here are successively a counting sub-module 1, a counting sub-module 2, . . . , a counting sub-module N. A counting sub-module i represent the i-th counting sub-module, and i is an integer greater than 0 and less than or equal to N.

It is to be noted that, in the embodiment of the present disclosure, each counting sub-module may include a first input end, a second input end, and an output end. The first input end of each counting sub-module is connected with the counting signal; a second input end of a first counting sub-module is connected with a first power supply signal, a second input end of a j-th counting sub-module is connected with an output end of a (j−1)th counting sub-module, and an output end of the Nth counting sub-module is configured to output the first counting pulse signal, where j is an integer greater than 1 and less than or equal to N.

Here, the first power supply signal may be a power supply signal provided by a first power supply. The first power supply may be a constant power supply. For example, the first power supply may be a VSS power supply, and is configured to provide a constant low-level signal, such that the first power supply signal may also be referred to as a ground signal.

It is further to be noted that, in the embodiment of the present disclosure, each counting sub-module may also include a control end, which is configured to receive the corresponding decoded sub-signal. In this way, according to the received decoded sub-signal, the required target counting module may be determined from the N counting sub-modules.

Specifically, when N is equal to 1, the first counting module 302 includes only one counting sub-module, and accordingly, the decoded signal may include only one decoded sub-signal; and the counting sub-module is the target counting module. In this case, a first input end of the counting sub-module is connected with the counting signal, a second input end of the counting sub-module is connected with the first power supply signal, a control end of the counting sub-module is configured to receive the unique decoded sub-signal, and an output end of the counting sub-module is configured to output the first counting pulse signal.

In the embodiment of the present disclosure, when N is equal to 1, there is only one implementation of the target counting module actually, which cannot meet the requirements for various counting threshold levels. Therefore, in the embodiment of the present disclosure, N is generally greater than 1. That is to say, the counting circuit 30 may be applied to various different counting threshold level scenarios, may determine the specific counting threshold according to the decoding of the first mode signal, and then selects the corresponding numbers of the counting sub-modules as the target counting modules, such that the counting circuit can be applicable to the counting scenarios (such as an error counting scenario and other counting scenarios) of different counting threshold levels, and the flexibility and adaptability are better.

Exemplarily, as shown in FIG. 4, when N is greater than 1, the first input end of each counting sub-module is configured to receive the counting signal, and the control end of each counting sub-module is configured to receive the corresponding decoded sub-signals; and a second input end of a 1st counting sub-module (that is, the counting sub-module 1) is connected with the first power supply (VSS); output ends of the 1st counting sub-module to the (N−1)th counting sub-module are connected with a second input end of the next counting sub-module; and an output end of the last (Nth) counting sub-module (i.e., the counting sub-module N) is configured to output the first counting pulse signal.

Figure 5:
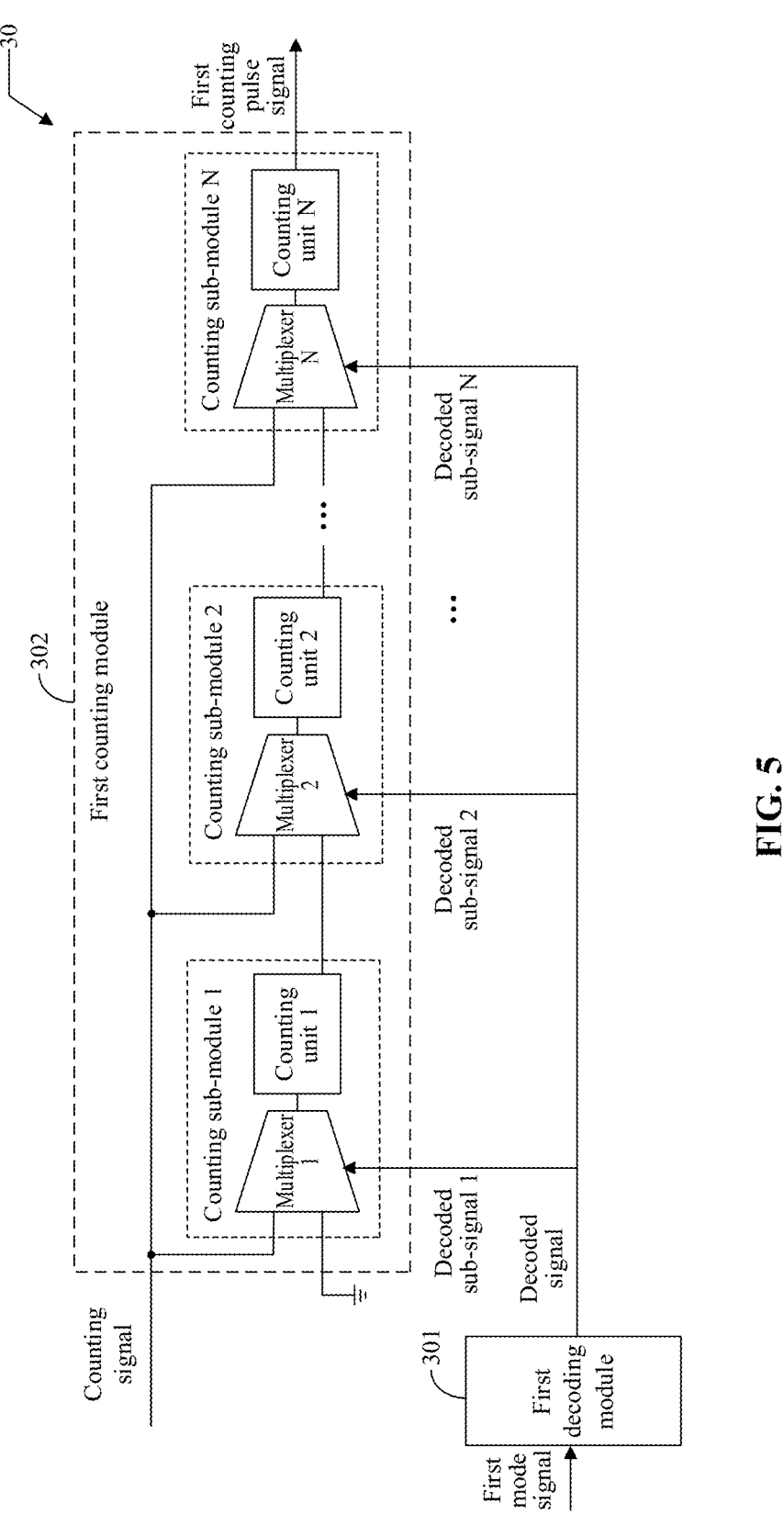
FIG. 5 is a third schematic diagram of a composition structure of a counting circuit according to an embodiment of the present disclosure.

Further, in some embodiments, on the basis of the counting circuit 30 shown in FIG. 4, referring to FIG. 5, the i-th counting sub-module may include an i-th MUX and an i-th counting unit (which may be, for example, implemented as an i-th counting sub-subcircuit). A first input end of the i-th MUX is used as a first input end of the i-th counting sub-module to receive the counting signal, a second input end of the i-th MUX is used as a second input end of the i-th counting sub-module to receive a first input signal, and an output end of the i-th MUX is connected with a clock end of the i-th counting unit; and an output end of the i-th counting unit is used as an output end of the i-th counting sub-module to output an i-th intermediate signal.

The i-th MUX is configured to receive the i-th decoded sub-signal, and select from the counting signal and the first input signal according to the i-th decoded sub-signal and output an i-th selection signal.

The i-th counting unit is configured to receive and count the i-th selection signal, and output the i-th intermediate signal.

Here, when i is equal to 1, the first input signal is the first power supply signal; when i is greater than 1 and less than or equal to N, the first input signal is an (i−1)th intermediate signal outputted by an (i−1)th counting unit (which may be, for example, implemented as an (i−1)th counting sub-subcircuit); and when i is equal to N, an Nth intermediate signal is the first counting pulse signal.

It is to be noted that, in the embodiment of the present disclosure, as shown in FIG. 5, each counting sub-module includes one MUX and one counting unit. That is, the counting sub-module 1 (1st counting sub-module) includes a MUX 1 (1st MUX) and a counting unit 1 (1st counting unit). the counting sub-module 2 (2nd counting sub-module) includes a MUX 2 (2nd MUX) and a counting unit 2 (2nd counting unit), . . . , the counting sub-module N (the Nth counting sub-module) includes a MUX N (Nth MUX) and a counting unit N (Nth counting unit).

In each counting sub-module, the MUX is configured to receive the corresponding decoded sub-signal. That is, the MUX 1 is configured to receive the decoded sub-signal 1 (1st decoded sub-signal), the MUX 2 is configured to receive the decoded sub-signal 2 (2nd decoded sub-signal), . . . , the MUX N is configured to receive the decoded sub-signal N (Nth decoded sub-signal).

Each MUX may include a first input end, a second input end, a control end, and an output end. The first input end of the i-th MUX is the first input end of the i-th counting sub-module; the second input end of the i-th MUX is the second input end of the i-th counting sub-module; the control end of the i-th MUX is the control end of the i-th counting sub-module; the output end of the i-th MUX is connected with the clock end of the i-th counting unit; and the output end of the i-th counting unit is the output end of the i-th counting sub-module.

Specifically, as shown in FIG. 5, in the counting sub-module 1, an output end of the MUX 1 may select one of the counting signal and the first power supply signal as a 1st selection signal for output, a clock end of the counting unit 1 is configured to receive the 1st selection signal, and an output end of the counting unit 1 is configured to output a 1st intermediate signal. In the counting sub-module 2, an output end of the MUX 2 may select one of the counting signal and the 1st intermediate signal as a 2nd selection signal for output, a clock end of the counting unit 2 is configured to receive the 2nd selection signal, and an output end of the counting unit 2 is configured to output a 2nd intermediate signal; and so on. Similarly, in the counting sub-module N, an output end of the MUX N may select one of the counting signal and an (N−1)th intermediate signal as an Nth selection signal for output, a clock end of the counting unit N is configured to receive the Nth selection signal, and an output end of the counting unit N is configured to output an Nth intermediate signal (i.e., the final first counting pulse signal).

In this way, according to the N-bits decoded sub-signals, if the level value of the 1st-bit decoded sub-signal (decoded sub-signal 1) is the first value, the MUX 1 outputs the counting signal as the 1st selection signal, in this case, the cascaded counting sub-module 1 to the counting sub-module N are used as the target counting modules; if the level value of the 2nd-bit decoded sub-signal (decoded sub-signal 2) is the first value, the MUX 2 outputs the counting signal as the 2nd selection signal, in this case, the cascaded counting sub-module 2 to the counting sub-module N are used as the target counting modules; and so on, if the level value of the Nth-bit decoded sub-signal (decoded sub-signal N) is the first value, the MUX N outputs the counting signal as the Nth selection signal, in this case, only the counting sub-module N is used as the target counting module. Therefore, the target counting module can be adaptively selected according to the N-bits decoded sub-signals, so as to meet counting statistics for different counting threshold levels.

Further, for a j-th counting unit, in some embodiments, the i-th counting unit is an asynchronous binary counter.

The asynchronous binary counter may include a plurality of first flip-flops cascaded in sequence. An input end (D) of the first flip-flop of each stage is connected with a second output end (/Q) of the first flip-flop itself, and the second output end (/Q) of the first flip-flop of each stage is connected with a clock end (CLK) of the nest-stage first flip-flop; a clock end of a first-stage first flip-flop is connected with the output end of the i-th MUX; and a second output end (/Q) of the last stage first flip-flop is used as the output end of the i-th counting unit to output the i-th intermediate signal.

Figure 6:
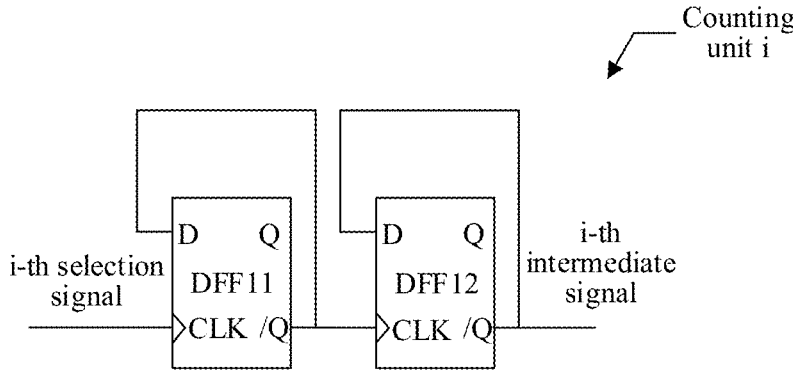
FIG. 6 is a schematic diagram of a composition structure of a counting unit according to an embodiment of the present disclosure.

In the embodiment of the present disclosure, for the counting unit i, taking the asynchronous binary counter shown in FIG. 6 as an example, the counting unit i may include two first flip-flops. Here, the first flip-flop may be a D-type flip-flop. The D-type flip-flop (Data Flip-Flop or Delay Flip-Flop (DFF)) is an information storage device having a memory function and two stable states, is the most basic logical unit that constitutes various sequential circuits, and is also an important unit circuit in a digital logic circuit. The D-type flip-flop has two stable states, which are "0" and "1". Under the triggering of a signal trigger edge received by a clock end of the flip-flop, one stable state may be turned to the other stable state.

For the first flip-flop (DFF11 or DFF12) in FIG. 6, the first flip-flop includes the input end (D), the clock end (CLK), the first output end (Q), and the second output end (/Q). Here, the input end (D) of the first flip-flop of each stage is connected with the second output end (/Q) of the first flip-flop itself, and the second output end (/Q) of the first flip-flop of each stage is also connected with the clock end (CLK) of the next stage first flip-flop. In addition, the clock end (CLK) of the first-stage first flip-flop (i.e., DFF11) is connected with the i-th selection signal, and the second output end (/Q) of the last stage first flip-flop (i.e., DFF12) is configured to output the i-th intermediate signal.

It is further to be noted that, assuming that the decoded signal includes eight decoded sub-signals, the first counting module 302 includes eight counting sub-modules, and the counting unit in each counting sub-module includes two cascaded first flip-flops. In this case, if the level value of the 1st-bit decoded sub-signal (decoded sub-signal 1) is the first value, the target counting module is obtained by cascading the counting sub-module 1 to the counting sub-module 8, such that the current target counting module includes cascaded 16 first flip-flops. Alternatively, if the level value of the 7th-bit decoded sub-signal (decoded sub-signal 7) is the first value, the target counting module is obtained by cascading the counting sub-module 7 to the counting sub-module 8, such that the current target counting module includes cascaded 4 first flip-flops. Alternatively, if the level value of the 8th-bit decoded sub-signal (decoded sub-signal 8) is the first value, the target counting module only includes the counting sub-module 8, such that the current target counting module includes cascaded 2 first flip-flops.

In this way, after the first decoding module 301 decodes the first mode signal to obtain eight bits decoded sub-signals, according to the eight bits decoded sub-signals, not only the counting threshold level may be determined, but also the counting signal may be selected as a clock input of a certain counting unit (specifically referring to the first flip-flop of a certain stage), such that the level of the first counting module 302 can be integrally controlled, so as to implement counting statistics for different counting threshold levels.

Figure 7:
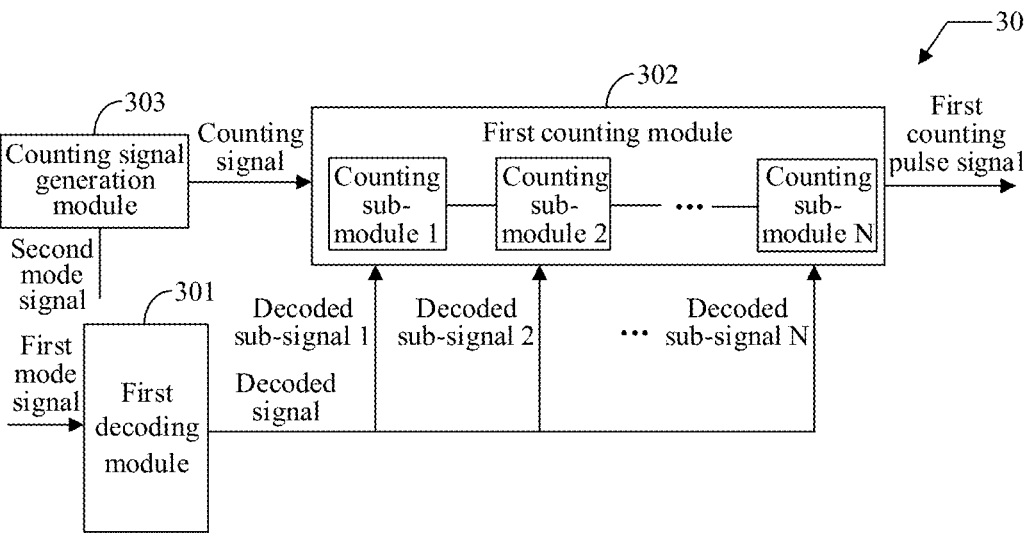
FIG. 7 is a fourth schematic diagram of a composition structure of a counting circuit according to an embodiment of the present disclosure.

In some embodiments, on the basis of the counting circuit 30 shown in FIG. 3, referring to FIG. 7, the counting circuit 30 may also include a counting signal generation module (which may be, for example, implemented as a counting signal generation circuit) 303.

The counting signal generation module 303 is configured to receive a second mode signal, and generate the counting signal in response to the second mode signal, herein the second mode signal indicates a target counting mode to be executed.

It is to be noted that, in the embodiment of the present disclosure, the first mode signal is different from the second mode signal. The first mode signal may be a mode signal for setting the counting threshold in the mode register MR15; and the second mode signal may be a mode signal for setting a counting mode in the mode register MR14.

It is further to be noted that, in the embodiment of the present disclosure, there may be two counting modes, which are a codeword counting mode and a row counting mode. The codeword counting mode is configured to count how many error codewords there are; and the row counting mode is configured to count how many rows with at least one error codeword. Therefore, in some embodiments, when the counting circuit 30 executes an Error Check and Scrub (ECS) operation, the following operations are performed.

In a case that a level value of the second mode signal is a first value, it is determined that the target counting mode is a codeword counting mode, and the counting signal is a first counting signal.

Alternatively, in a case that the level value of the second mode signal is a second value, it is determined that the target counting mode is a row counting mode, and the counting signal is a second counting signal.

In the embodiment of the present disclosure, the first counting signal may also be referred to as a codeword error counting signal; and the second counting signal may also be referred to as a codeword error row counting signal.

In the embodiment of the present disclosure, the first value may be Logic 1 indicating a high level, and the second value may be Logic 0 indicating a low level; or the first value may be Logic 0 indicating the low level, and the second value may be Logic 1 indicating the high level. No limitations are constituted thereto.

Exemplarily, if the first value is Logic 1, and the second value is Logic 0, when the second mode signal is equal to Logic 1, it is the codeword counting mode, and the corresponding counting signal is the first counting signal (i.e., the codeword error counting signal). When the second mode signal is equal to Logic 0, it is the row counting mode, and the corresponding counting signal is the second counting signal (i.e., the codeword error row counting signal). In this way, in the counting circuit 30, whether to execute the row counting mode or the codeword counting mode may be selected through the second mode signal.

Figure 8:
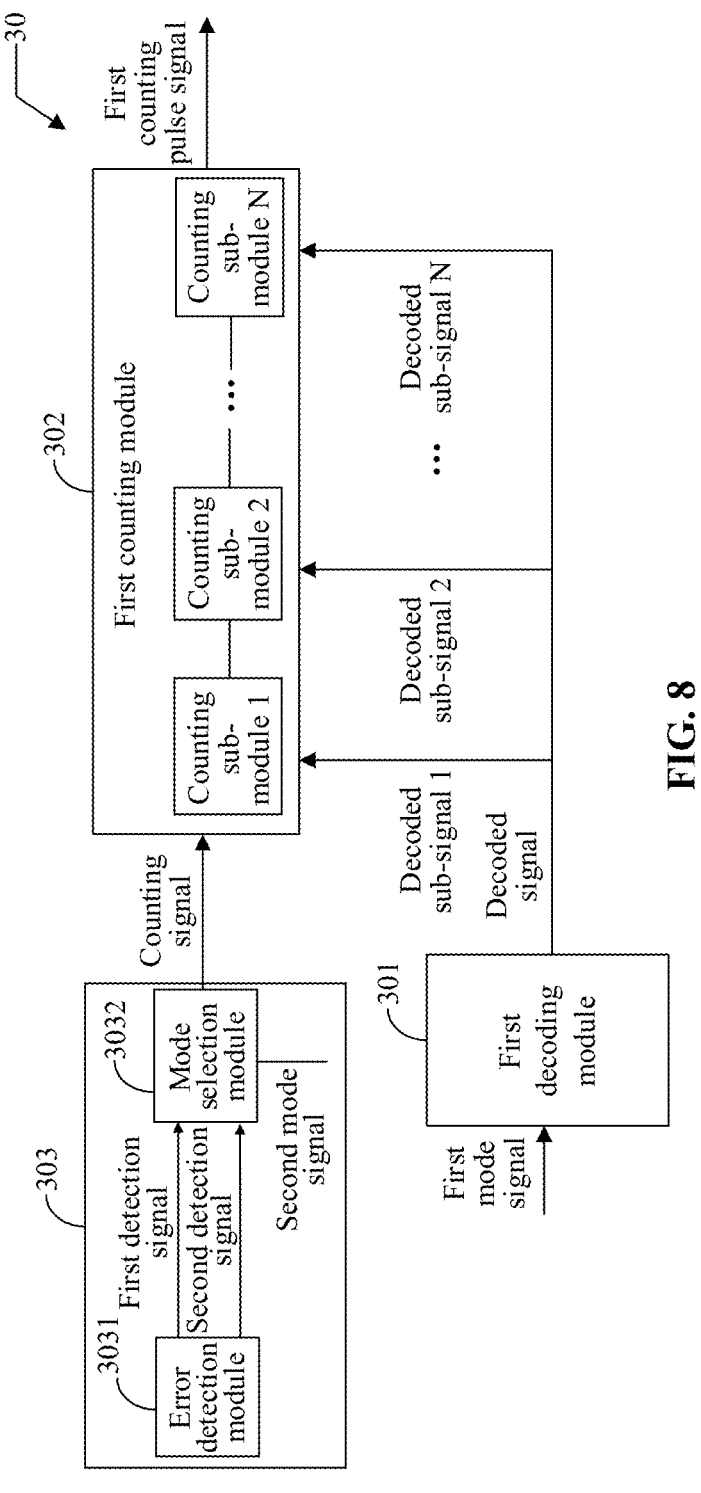
FIG. 8 is a fifth schematic diagram of a composition structure of a counting circuit according to an embodiment of the present disclosure.

In some embodiments, on the basis of the counting circuit 30 shown in FIG. 7, referring to FIG. 8, the counting signal generation module 303 may include an error detection module (which may be, for example, implemented as an error detection circuit) 3031 and a mode selection module (which may be, for example, implemented as a mode selection circuit) 3032.

The error detection module 3031 is configured to: generate a first detection signal according to the detected codeword error, send the first detection signal to the mode selection module 3032; and generate a second detection signal according to the detected row with codeword error, and send the second detection signal to the mode selection module 3032.

The mode selection module 3032 is connected with the error detection module 3031, and is configured to: receive a second mode selection signal, the first detection signal and the second detection signal; and in response to the control of the second mode signal, generate the first counting signal according to the first detection signal, or generate the second counting signal according to the second detection signal.

In the embodiment of the present disclosure, the error detection module 3031 may detect the codeword error to generate a first detection signal, and may also detect the row with the codeword error to generate a second detection signal; and then send the first detection signal and the second detection signal simultaneously to the mode selection module 3032. In this case, in the mode selection module 3032, it is determined whether it is the codeword counting mode or the row counting mode according to the received second mode selection signal. If it is the codeword counting mode, the first counting signal may be generated according to the first detection signal; or if it is the row counting mode, the second counting signal may be generated according to the second detection signal.

Figure 9:
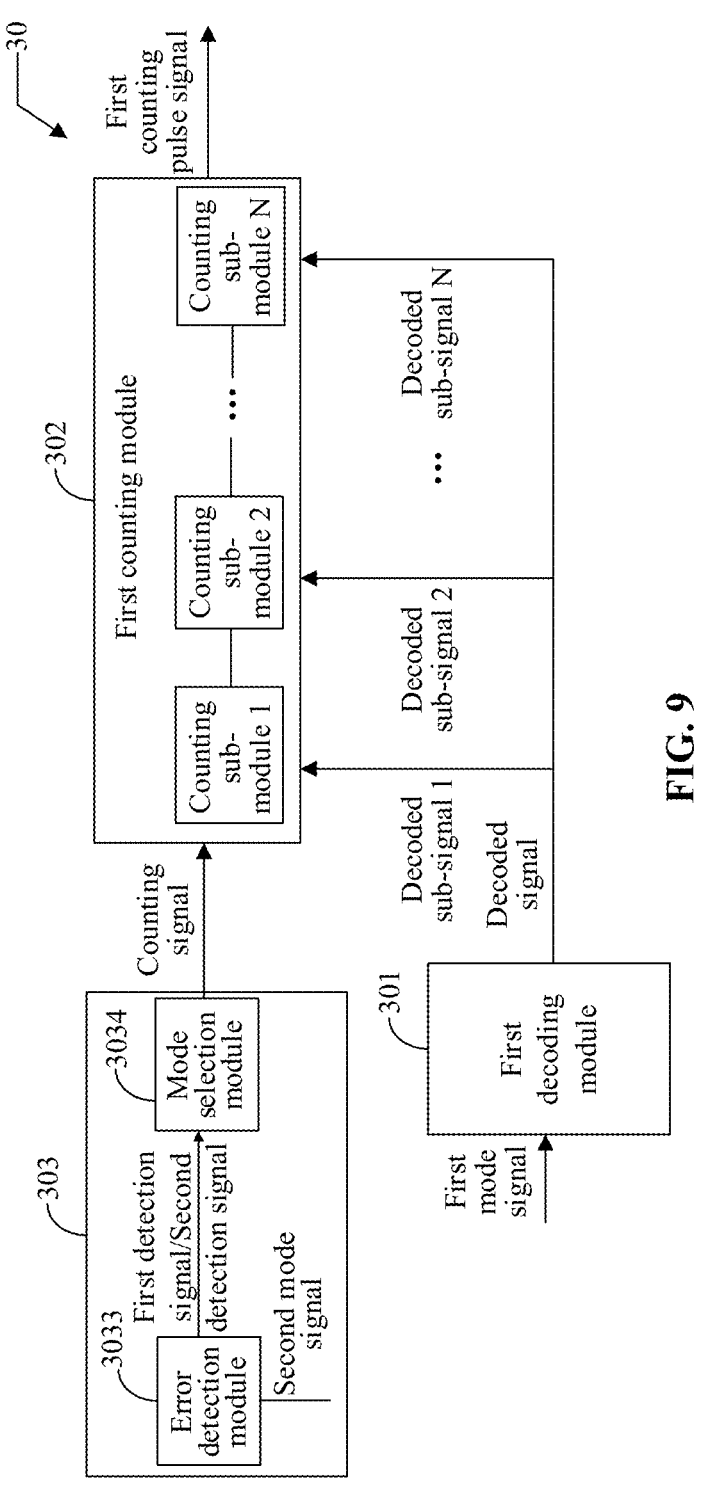
FIG. 9 is sixth a schematic diagram of a composition structure of a counting circuit according to an embodiment of the present disclosure.

In some embodiments, on the basis of the counting circuit 30 shown in FIG. 7, referring to FIG. 9, the counting signal generation module 303 may include an error detection module 3033 and a mode selection module 3034.

The error detection module 3033 is configured to: receive a second mode selection signal; and in response to the second mode selection signal, detect the codeword error in the codeword counting mode, generate a first detection signal according to the detected codeword error, and send the first detection signal to the mode selection module 3034; or detect the row with codeword error in a row counting mode, generate a second detection signal according to the detected row with codeword error, and send the second detection signal to the mode selection module 3034.

The mode selection module 3034 is connected with the error detection module 3033, and is configured to: receive the first detection signal or the second detection signal; and generate the first counting signal according to the first detection signal, or generate the second counting signal according to the second detection signal.

In the embodiment of the present disclosure, the error detection module 3033 may be used to determine whether it is the codeword counting mode or the row counting mode after receiving the second mode selection signal. If it is the codeword counting mode, the first detection signal is generated according to the detected codeword error, and sent to the mode selection module 3034. Or if it is the row counting mode, the second detection signal is generated according to the detected row with the codeword error, and sent to the mode selection module 3034. Then the first counting signal or the second counting signal is generated correspondingly according to the first detection signal or the second detection signal.

It is further to be noted that, in the embodiment of the present disclosure, different counting modes correspond to different detection signals; and different detection signals correspond to different counting signals (for example, the codeword error counting signal or the codeword error row counting signal). Here, different counting signals may represent the number of rows with at least one codeword error or the total number of codeword errors, such that a multiple relationship between the counting value represented by the counting signal and the counting threshold may be determined according to the counting circuit 30. In other words, how many times the counting threshold is included in the counting value.

Exemplarily, taking the codeword counting mode as an example, every time when one codeword error is detected, a pulse is correspondingly generated, such that the counting signal having a plurality of pulses can be generated. For the counting circuit 30, the first mode signal may represent a preset counting threshold, at least one decoded sub-signal may be obtained by decoding according to the first mode signal, and the target counting module corresponding to the counting threshold may be determined according to the at least one decoded sub-signal, such that by counting the counting signal through the target counting module, the pulse may be outputted every time the counting threshold is reached, so as to generate the first counting pulse signal. That is, the first counting pulse signal represents a multiple relationship between the counting value corresponding to the counting signal and the counting threshold.

The embodiment of the present disclosure provides a counting circuit, different decoded signals may represent different counting threshold levels, and different target counting modules can be adaptively selected according to different decoded signals, such that counting statistics for different counting threshold levels can be met, and the problem of excessive connecting wires caused by a large number of logic devices used in the related art may also be avoided, the complexity of a circuit is reduced, thereby improving the performance of a memory.

Figure 10:
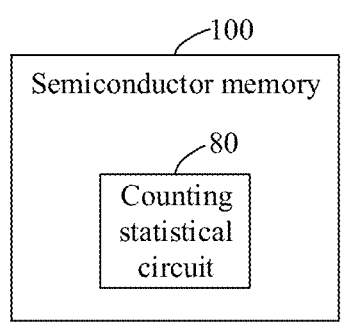
FIG. 10 is a schematic diagram of a composition structure of a semiconductor memory according to an embodiment of the present disclosure.

In another embodiment of the present disclosure, FIG. 10 is a schematic diagram of a composition structure of a semiconductor memory according to an embodiment of the present disclosure. As shown in FIG. 10, the semiconductor memory 100 may include a counting statistical circuit 80.

Figure 11:
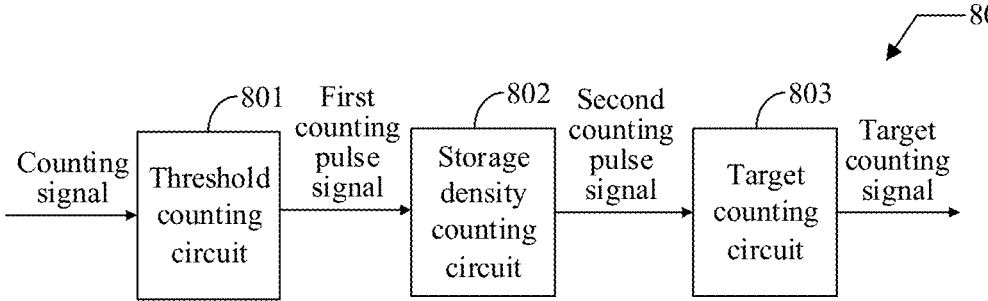
FIG. 11 is a first schematic diagram of a composition structure of a counting statistical circuit according to an embodiment of the present disclosure.

In some embodiments, FIG. 11 is a schematic diagram of a composition structure of a counting statistical circuit 80. As shown in FIG. 11, the counting statistical circuit 80 may include a threshold counting circuit 801, a storage density counting circuit 802, and a target counting circuit 803.

The threshold counting circuit 801 is configured to receive counting signals, count the counting signal through an internal target counting module (which may be, for example, implemented as an internal target counting circuit), and output the first counting pulse signal every time when a counting value corresponding to the counting signal reaches an integer multiple of a counting threshold.

The storage density counting circuit 802 is configured to count the first counting pulse signal, and output the second counting pulse signal every time when a counting value corresponding to the first counting pulse signal reaches an integer multiple of a preset storage density.

The target counting circuit 803 is configured to count the second counting pulse signal, and output a target counting signal.

It is to be noted that, in this embodiment of the present disclosure, the threshold counting circuit 801 may be the counting circuit 30 of any one of the foregoing embodiments.

It is further to be noted that, in the embodiment of the present disclosure, the first counting pulse signal represents a multiple relationship between a counting value corresponding to the counting signal and a counting threshold. The second counting pulse signal may represents a multiple relationship between a counting value corresponding to the first counting pulse signal and a preset storage density. The target counting signal represents a counting value corresponding to the second counting pulse signal. A target counting result is the product of the counting value represented by the target counting signal, the counting threshold and the preset storage density. The target counting result here can indicate the total number of errors counted by the counting statistical circuit 80 for the current error data. Therefore, after the target counting result is obtained, a preset counting range corresponding to the target counting result may further be determined according to the target counting result, so as to load to a preset MR.

It is further to be noted that, in the embodiment of the present disclosure, the threshold counting circuit 801 may obtain a first counting value; the storage density counting circuit 802 may obtain a second counting value; and the target counting circuit 803 may obtain a third counting value. The first counting value indicates how many times the counting threshold is included in the first counting pulse signal. The second counting value indicates how many times the preset storage density is included in the second counting pulse signal. The third counting value is a counting value represented by the target counting signal. Therefore, the target counting result may be determined according to the counting threshold, the preset storage density and the third counting value. More specifically, assuming that a preset value is a product value of the counting threshold and the preset storage density, the target counting result is the product of the third counting value and the preset value.

In some embodiments, for the storage density counting circuit 802, the storage density counting circuit 802 may be an asynchronous binary counter.

The asynchronous binary counter includes a plurality of second flip-flops cascaded in sequence. An input end (D) of the second flip-flop of each stage is connected with a second output end (/Q) of the second flip-flop itself, and the second output end (/Q) of the second flip-flop of each stage is connected with a clock end (CLK) of the next stage second flip-flop; a clock end of a first-stage second flip-flop is connected with an output end of the threshold counting circuit 801; and a second output end (/Q) of the last stage second flip-flop is used as an output end of the storage density counting circuit to be connected with a clock end (CLK) of the target counting circuit 803.

It is to be noted that, in the embodiment of the present disclosure, the preset storage density indicates that the memory of the DRAM is a plurality of Gbs, such as 8 Gb, 16 Gb, and 32 Gb. In a practical application, the preset storage density may be specifically set according to actual situations, and is not limited herein.

It is further to be noted that, in the embodiment of the present disclosure, there is an association relationship between the number of the second flip-flops and the preset storage density, where the preset storage density is d, the number of the second flip-flops is y, and $d=2^y$.

Figure 12:
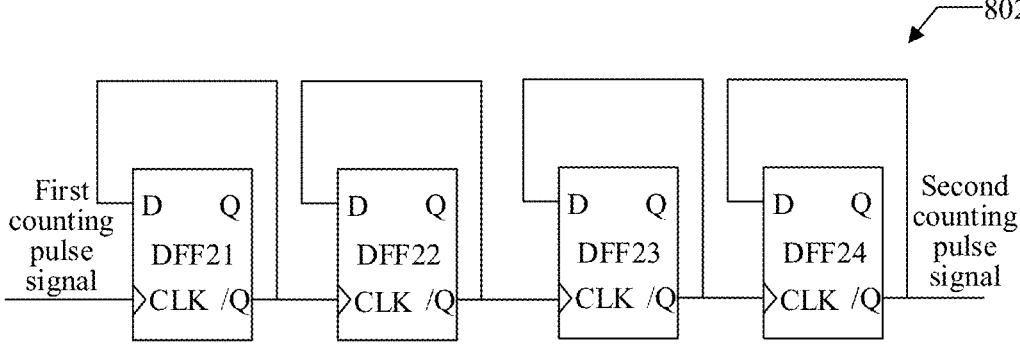
FIG. 12 is a schematic diagram of a composition structure of a storage density counting circuit according to an embodiment of the present disclosure.

For the storage density counting circuit 802, taking the asynchronous binary counter shown in FIG. 12 as an example, assuming that the preset storage density is 16 Gb, the asynchronous binary counter includes four second flip-flops. Here, the second flip-flop may be the D-type flip-flop. The four second flip-flops are DFF21, DFF22, DFF23, and DFF24, respectively; and the DFF21, the DFF22, the DFF23, and the DFF24 are cascaded.

For the second flip-flop of each stage in FIG. 12, the second flip-flop includes the input end (D), the clock end (CLK), the first output end (Q), and the second output end (/Q). Here, the input end (D) of the second flip-flop of each stage is connected with the second output end (/Q) of the second flip-flop itself, and the second output end (/Q) of the second flip-flop of each stage is also connected with the clock end (CLK) of the next stage second flip-flop. In addition, the clock end (CLK) of the first-stage second flip-flop (i.e., DFF21) is configured to receive the first counting pulse signal; and the second output end (/Q) of the last stage second flip-flop (i.e., DFF24) is configured to output the second counting pulse signal. The second counting pulse signal may represent the multiple relationship between the counting value corresponding to the first counting pulse signal and the preset storage density, or may be a multiple relationship between the current error data and (the counting threshold*the preset storage density).

In some embodiments, for the target counting circuit 803, the target counting circuit 803 may be an asynchronous binary counter.

The asynchronous binary counter includes a plurality of third flip-flops cascaded in sequence. An input end (D) of the third flip-flop of each stage is connected with a second output end (/Q) of the third flip-flop itself, and the second output end (/Q) of the third flip-flop of each stage is connected with a clock end (CLK) of the next stage third flip-flop; a clock end of a first-stage third flip-flop is connected with an output end of the storage density counting circuit 802.

In some embodiments, the target counting signal may be a binary number including a 0th-bit target counting sub-signal to an (M−1)th-bit target counting sub-signal.

Accordingly, the number of the third flip-flops is M.

A first output end (Q) of a (k+1)th-stage third flip-flop is configured to output a k-th-bit target counting sub-signal, where k is an integer greater than or equal to 0 and less than M, and M is an integer greater than zero.

Figure 13:
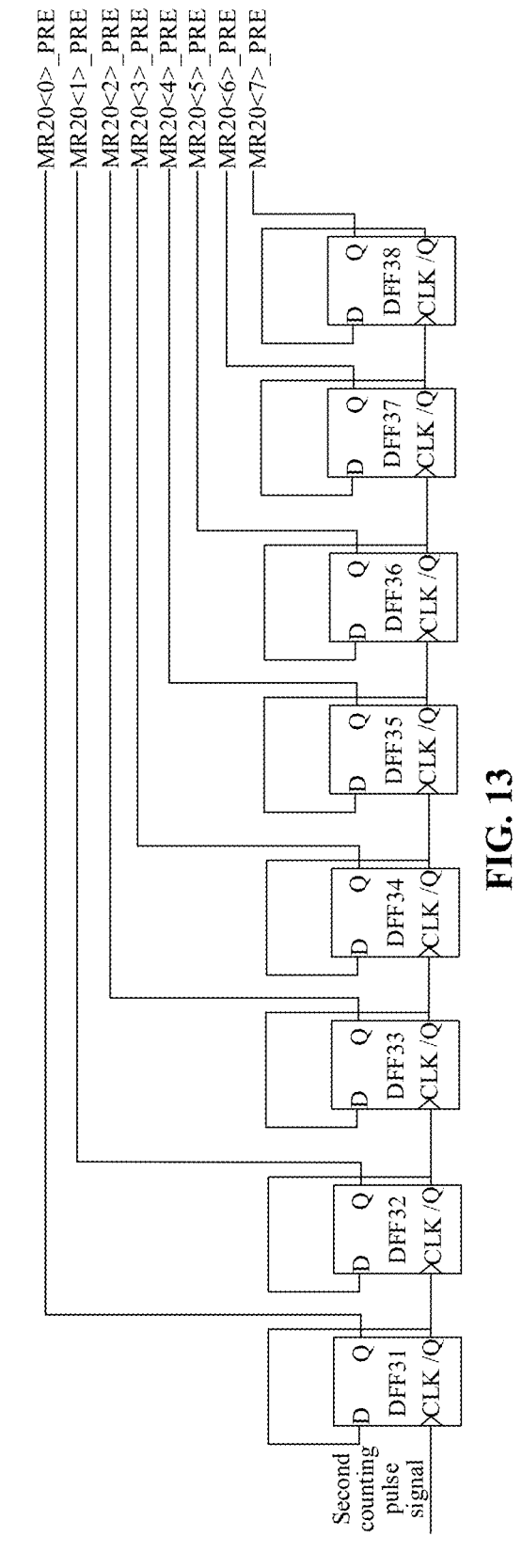
FIG. 13 is a schematic diagram of a composition structure of a target counting circuit according to an embodiment of the present disclosure.

It is to be noted that, for the target counting circuit 803, taking the asynchronous binary counter shown in FIG. 13 as an example, assuming that M is equal to 8, the asynchronous binary counter includes eight third flip-flops. Here, the third flip-flop may be the D-type flip-flop. The eight third flip-flops are DFF31, DFF32, DFF33, DFF34, DFF35, DFF36, DFF37, and DFF38, respectively; and the DFF31, the DFF32, the DFF33, the DFF34, the DFF35, the DFF36, the DFF37, and the DFF38 are cascaded.

For the third flip-flop of each stage in FIG. 13, the third flip-flop includes the input end (D), the clock end (CLK), the first output end (Q), and the second output end (/Q). Here, the clock end (CLK) of the first-stage third flip-flop (i.e., DFF31) is configured to receive the second counting pulse signal; the input end (D) of the third flip-flop of each stage is connected with the second output end (/Q) of the third flip-flop itself, and the second output end (/Q) of the third flip-flop of each stage is also connected with the clock end (CLK) of the next stage third flip-flop; and the first output end (Q) of the third flip-flop of each stage is configured to output one bit target counting sub-signal. In FIG. 13, eight bits target counting sub-signals are outputted, i.e., MR20<0>_PRE, MR20<1>_PRE, . . . , MR20<7>_PRE. The eight bits target counting sub-signals may indicate the third counting value; and a final target counting result can be determined according to the counting threshold, the preset storage density and the third counting value.

Figure 14:
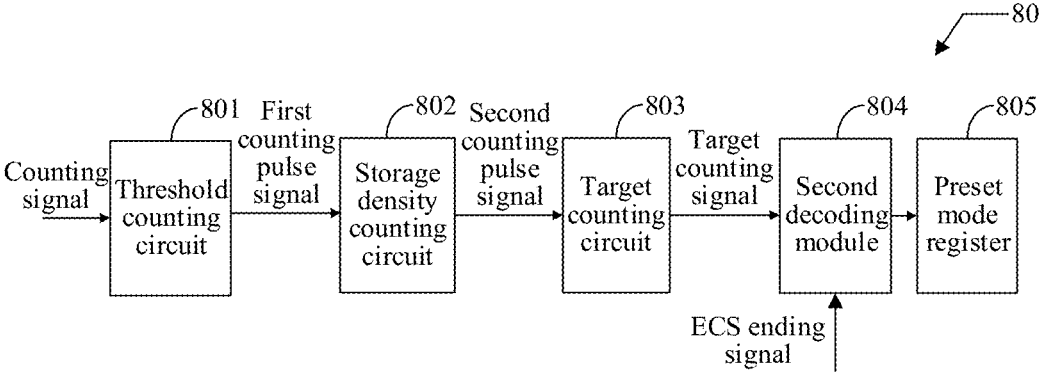
FIG. 14 is a second schematic diagram of a composition structure of a counting statistical circuit according to an embodiment of the present disclosure.

Further, in some embodiments, on the basis of the counting statistical circuit 80 shown in FIG. 11, referring to FIG. 14, the counting statistical circuit 80 may also include a second decoding module (which may be, for example, implemented as a second decoding circuit) 804 and a preset MR 805.

The second decoding module 804 is configured to decode the target counting signal according to a received ECS ending signal, and store in a preset MR 805.

It is to be noted that, in the embodiment of the present disclosure, the preset MR 805 may be the MR20. In some embodiments, the preset MR 805 includes at least M bits, each bit corresponds to a preset counting range, and the preset counting ranges do not overlap with each other.

The second decoding module 804 is further configured to, when a target counting result meets a k-th preset counting range, set a value stored in a k-th-bit of in the preset MR to a first value, and set values stored in other bits other than the k-th-bit to a second value.

Here, the first value may be Logic 1 indicating a high level, and the second value may be Logic 0 indicating a low level; or the first value may be Logic 0 indicating the low level, and the second value may be Logic 1 indicating the high level. No limitations are constituted thereto.

Here, the target counting result may be a product of the counting value represented by the target counting signal and the preset value, and the preset value is a product value of the counting threshold and the preset storage density. Therefore, the minimum value of the k-th preset counting range is set to be a product of the preset value and $2^k$; and the maximum value of the k-th preset counting range is set to be a difference between the product of the preset value and $2^{k+1}$ and 1.

It is further to be noted that, in the embodiment of the present disclosure, assuming that the counting threshold is denoted as ETC, the preset storage density is denoted as Density (Gb), the minimum value of the k-th preset counting range may be denoted as EC[k]min, and the maximum value of the k-th preset counting range may be denoted as EC[k] max. Specific calculation equations are as follows.

$$EC[k] \min = ETC * \text{Density } (Gb) * 2^k \quad (1)$$

$$EC[k] \max = \quad (2)$$

$$2 * \left(ETC * \text{Density } (Gb) * 2^k\right) - 1 = ETC * \text{Density } (Gb) * 2^{k+1} - 1 \quad 5$$

k is an integer greater than or equal to 0 and less than M; and M represents the number of bits included in the preset MR 805, and M is a positive integer.

It is to be understood that, taking error counting as an example, after the ECS ending signal is received, it indicates that error counting of the current ECS operation is completed. When M is equal to 8, by decoding the target counting signal, an error counting decoded signal may be obtained and is denoted as EC[7:0]; and a value stored in a corresponding bit of the mode register MR20 is set to the first value according to the error counting decoded signal EC[7:0].

Specifically, the error counting decoded signal EC[7:0] may represent the error counts within a certain counting range. EC[7:0] may include EC[0], EC[1], EC[2], EC[3], EC[4], EC[5], EC[6], and EC[7]. When the first value is Logic 1 and the second value is Logic 0, EC[0]=1 corresponds to a 0th preset counting range, EC[1]=1 corresponds to a 1st preset counting range, EC[2]=1 corresponds to a 2nd preset counting range, . . . , EC[7]=1 corresponds to a 7th preset counting range. Exemplarily, Table 3 shows a schematic data range of eight preset counting ranges.

TABLE 3

| EC[ ] | Preset counting range |
| --- | --- |
| EC[0] = 1 | 64-127 |
| EC[1] = 1 | 128-255 |
| EC[2] = 1 | 256-511 |
| EC[3] = 1 | 512-1023 |
| EC[4] = 1 | 1024-2047 |
| EC[5] = 1 | 2048-4095 |
| EC[6] = 1 | 4096-8191 |
| EC[7] = 1 | 8192-16383 |

Here, after the final target counting result is obtained, if the target counting result is 125, the target counting result is within the 0th preset counting range, in this case, EC[0]=1, and then a 0th bit (i.e., MR20 OP[0]) in the MR20 is set to 1. If the target counting result is 456, the target counting result is within the 2nd preset counting range, in this case, EC[2]=1, and then a 2nd bit (i.e., MR20 OP[2]) of the MR20 is set to 1. If the target counting result is 3000, the target counting result is within the 5th preset counting range, in this case, EC[5]=1, and then a 5th bit (i.e., MR20 OP[5]) of the MR20 is set to 1, etc. That is, when the target counting result meets the corresponding preset counting range, a corresponding bit in the MR20 is set to 1.

In some other embodiments, the second decoding module 804 is further configured to, when the counting value represented by the target counting signal meets a k-th preset counting range, set a value stored in the k-th-bit of the preset MR to a first value, and set the values stored in other bits other than the k-th-bit to a second value.

Here, the minimum value of the k-th preset counting range may be denoted as EC[k]min, and the maximum value of the k-th preset counting range may be denoted as EC[k] max. Specific calculation equations are as follows.

$$EC[k] \min = 2^k \quad (3)$$

$$EC[k] \max = 2^{k+1} - 1 \quad (4)$$

k is an integer greater than or equal to 0 and less than M. Exemplarily, when M is equal to 8, Table 4 shows a schematic data range of eight preset counting ranges.

TABLE 4

| EC[ ] | Preset counting range |
| --- | --- |
| EC[0] = 1 | 1-1 |
| EC[1] = 1 | 2-3 |
| EC[2] = 1 | 4-7 |
| EC[3] = 1 | 8-15 |
| EC[4] = 1 | 16-31 |
| EC[5] = 1 | 32-63 |
| EC[6] = 1 | 64-127 |
| EC[7] = 1 | 128-255 |

Here, after the counting value (i.e., the third counting value) represented by the target counting signal is determined, if the third counting value is 1, that is, the third counting value is within the 0th preset counting range, in this case, EC[0]=1, and then the 0th bit (i.e., MR20 OP[0]) in the MR20 is set to 1. If the third counting value is 3, that is, the third counting value is within the 1st preset counting range, in this case, EC[1]=1, and then a 1st bit (i.e., MR20 OP[1]) in the MR20 is set to 1. If the third counting value is 45, the third counting value is within the 5th preset counting range, in this case, EC[5]=1, and then the 5th bit (i.e., MR20 OP[5]) in the MR20 is set to 1, etc. That is to say, when the third counting value meets the corresponding preset counting range, the corresponding bit in the MR20 is set to 1. It is to be noted that, the third counting value is different from the target counting result; and the third counting value is the counting value represented by the target counting signal, and specifically is the counting value of the target counting circuit 803 for the second counting pulse signal. The target counting result is not the counting value of the second counting pulse signal, and is the counting value (i.e., the number of pulses included by the counting signal) for the counting signal. The relationship between the target counting result and the third counting value is that the target counting result is the product of the third counting value, the counting threshold and the preset storage density.

In short, after a complete ECS operation, the target counting result is loaded in the MR20. MR20 OP[7:0] can represent the error count within a certain range; and when the highest bit of EC[7:0] being 1 is outputted, a corresponding bit of the MR20 OP[7:0] is set to 1. Since the MR20 records the final target counting result, when the highest bit of the target counting result is 1, the corresponding bit is set to 1 and simultaneously loaded in the MR20. In addition, it is to be noted that, when another lower bit is 1, the bit is set to 1 at the previous moment; and once a bit higher than the bit of the previous moment becomes 1, the lower bit then become 0, and the higher bit is set to 1.

To sum up, the Error Counter may select and execute the codeword counting mode or the row counting mode through the MR14 OP[5]. After the DRAM completes the complete ECS operation, the value counted by the EC load the target counting result in the MR20 according to the counting threshold set by the MR15[2:0]. How to better design a threshold counting circuit to meet the counting threshold set by the MR15[2:0] is a problem to be solved in the present disclosure. In addition, the EC[7:0] corresponding to the MR20 OP[7:0] may represent counting statistics within a certain range. When the target counting result meets the corresponding preset counting range, a corresponding bit of the MR20 OP[7:0] is set to 1, otherwise is set to 0. Therefore, how to load the value of the EC[7:0] in the MR20 according to requirements is also a problem to be solved in the present disclosure.

In the embodiment of the present disclosure, the counting statistical circuit may be suitable for all operations for counting and loading results to a register. By determining, according to the obtained target counting result, the preset counting range for which the target counting result is met, a corresponding bit in the preset MR may be set to the first value, such that the technical problem of how to load the value of the EC[7:0] in an MR according to requirements in the related art is solved, and therefore, error counting results can be accurately loaded in the MR according to requirements.

Figure 15:
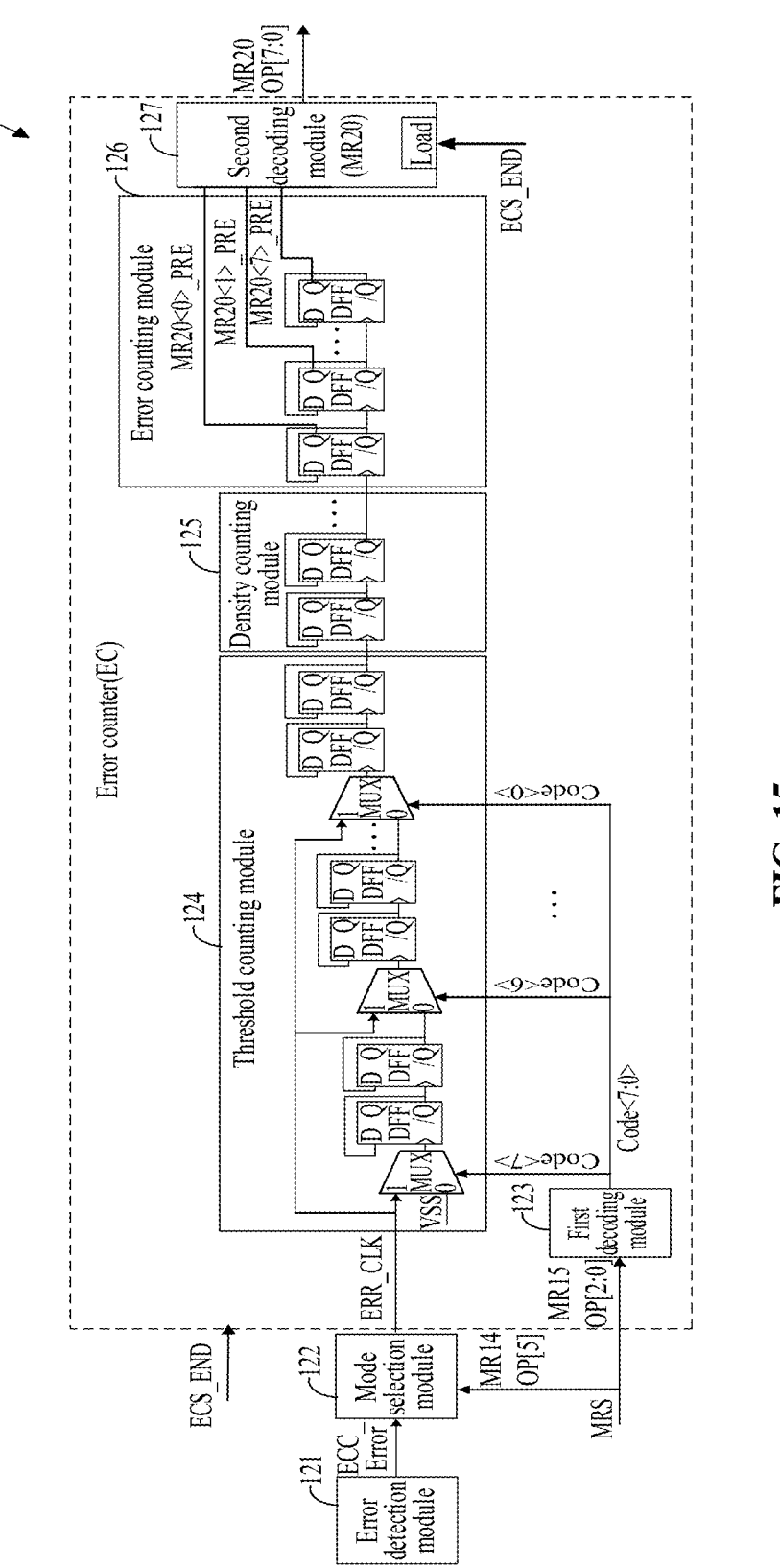
FIG. 15 is a detailed schematic structural diagram of a counting statistical circuit according to an embodiment of the present disclosure.

In a specific embodiment, FIG. 15 is a detailed schematic structural diagram of a counting statistical circuit 80. As shown in FIG. 15, the counting statistical circuit 80 may include an error detection module 121, a mode selection module 122, a first decoding module 123, a threshold counting module 124, a density counting module 125, an error counting module 126, and a second decoding module 127. The first decoding module 123 and the threshold counting module 124 are the threshold counting circuit described in the foregoing embodiments; the density counting module 125 is the storage density counting circuit described in the foregoing embodiments; and the error counting module 126 is the target counting circuit described in the foregoing embodiments.

In FIG. 15, the error detection module 121 may be configured to perform error checking when an ECS operation is performed on a storage array (DRAM Array), and generate an ECC_Error signal according to checked error. After the mode selection module 122 receives a second mode signal MR14 OP[5], if MR14 OP[5]=1, it is a codeword counting mode; and if MR14 OP[5]=0, it is a row counting mode. In regardless of the codeword counting mode or the row counting mode, a counting signal ERR_CLK may be generated according to the ECC_Error signal, and the ERR_CLK signal is used as a clock input of the threshold counting module 124. The first decoding module 123 may be a 3-8 decoder. Here, the first decoding module 123 performs decoding after receiving a first mode signal MR15 OP[2:0], and outputs a decoded signal Code<7:0>, which specifically includes eight decoded sub-signals, i.e., Code<0>, . . . , Code<6>, and Code<7>. The threshold counting module 124 may include eight counting sub-modules. Each counting sub-module includes an MUX and a counting unit. The MUX here may select any one of input signals to output according to the signal of a control end of the MUX, and the control end of each MUX is connected with the corresponding decoded sub-signal. Each counting unit is an asynchronous counter formed by cascading two first flip-flops, and a second output end (/Q) of the last stage first flip-flop is connected with a clock end of the density counting module 125. The density counting module 125 may be an asynchronous counter formed by cascading a plurality of second flip-flops, and the second output end (/Q) of the last stage second flip-flop is connected with a clock end of the error counting module 126. The error counting module 126 may be an asynchronous counter formed by cascading eight third flip-flops, first output ends (Q) of the eight third flip-flops are respectively configured to output MR20<0>_PRE, MR20<1>_PRE, . . . , and MR20<7>_PRE, and eight target counting sub-signals (MR20<0>_PRE, the MR20<1>_PRE, . . . , and the MR20<7>_PRE) may represent a final target counting result (which is specifically an error counting result). In this way, after an ECS ending signal ECS_END is received, it indicates that the current ECS operation is completed. In this case, the second decoding module 127 may decode the received eight target counting sub-signals, and store the final error counting result in an MR20 OP[7:0]. Specifically, when the target counting result meets a certain preset counting range, a corresponding bit of the MR20 OP[7:0] is set to 1, otherwise is set to 0.

It is to be noted that, in the embodiment of the present disclosure, the counting statistical circuit 80 may be applied to error counting in the ECS operation, as such further provided here is an EC, which specifically includes the first decoding module 123, the threshold counting module 124, the density counting module 125, the error counting module 126, and the second decoding module 127. For the EC, by using the method for selecting the ERR_CLK, the ERR_CLK is selected to be a clock input of the counting sub-module at which stage according to an ETC value decoded by an MR15, such that the stage of the entire counter is controlled, so as to meet error counting of different Threshold stages. The eight bits target counting sub-signals (which are loaded to the MR20 and can reflect the final error counting result) finally outputted by the entire counter vary with the number of flip-flops inserted in the entire counter, such that a larger number of the MUXes is no longer needed to change signals loaded to the MR20. Meanwhile, due to reduction of the number of the signals, coils are greatly reduced, and the logical area of a circuit can also be greatly reduced.

In FIG. 15, the ERR_CLK is used as an input clock signal of the threshold counting module 124. The MR15 obtains a signal Code<7:0> by decoding to determine a counting threshold, the stage of counting sub-module that an ERR-_CLK access may be selected. Exemplarily, when the input 1 of a first-stage MUX is selected, it indicates that the counting threshold is set to the maximum value, and there is an error counting with maximum number of flip-flops access. When a second-stage MUX is selected, a VSS signal is input to the first-stage MUX, the counting threshold is relatively less; and when Code<0> is 1, at this case, the counting threshold is equal to 4, therefore, only two flip-flops access. Since a technical specification defines that EC[k]min=ETC*Density(Gb)*$2^k$, the part of the density counting module 125 is then added. Using the capacity of 16 Gb as an example, 4 flip-flops may be additionally inserted. The final error counting module 126 includes 8 flip-flops, which are respectively configured to generate MR20<7: 0>_PRE. In this way, an EC[7:0] corresponding to an MR20 OP[7:0] may represent error counts within a certain range. When the error counting result meets the corresponding preset counting range, a corresponding bit of the MR20 OP[7:0] is set to 1, otherwise is set to 0, such that the error counting result can be loaded in the MR20.

It is to be noted that, in this embodiment of the present disclosure, the semiconductor memory 100 may include a DRAM. The DRAM may not only conform to the memory specifications such as DDR, DDR2, DDR3, DDR4, and DDR5, but also conform to the memory specifications such as LPDDR, LPDDR2, LPDDR3, LPDDR4, and LPDDR5, and no limitations are constituted herein.

It is further to be noted that, in the embodiment of the present disclosure, the design of related circuits of the EC in ECS in an integrated circuit design is mainly involved, especially relates to a DRAM DDR5 chip, which needs to perform a complete ECS operation at least every 24 hours and record the number of errors. Specifically, a counter is used here to record the number of rows with at least one error or record the number of codeword errors; and after all the ECS operation is executed, the recorded target counting result (which are specifically an error counting result) need to be loaded in a preset MR. In other words, the present technical solution may be applied to the related circuits of the Error Counter in ECS in the DRAM DDR5 chip, but is not limited to thereof, and other related circuits that perform counting and record the result are also suitable for the present technical solution. In still another embodiment of the present disclosure, FIG. 16 is a schematic flowchart of a counting method according to an embodiment of the present disclosure. As shown in FIG. 16, the method may include steps S1402 to S1403.

At S1401, a counting signal is received, the counting signal are counted by a target counting module (which may be, for example, implemented as a target counting circuit) in a threshold counting circuit, and a first counting pulse signal is outputted every time when a counting value corresponding to the counting signals reaches an integer multiple of a counting threshold.

At S1402, the first counting pulse signal is counted by a density counting circuit, and a second counting pulse signal is outputted every time when a counting value corresponding to the first counting pulse signal reaches an integer multiple of a preset storage density.

At S1403, the second counting pulse signal is counted by a target counting circuit, and a target counting signal is outputted.

It is to be noted that, the counting method of the embodiment of the present disclosure is applied to the counting statistical circuit described in the foregoing embodiments or a semiconductor memory integrated with the counting statistical circuit, and is specifically applied to a circuit design of a DDR5 Error Counter. That is, the counting method specifically relates to the design of related circuits of the Error Counter in ECS in a DRAM DDR5 chip, which needs to perform a complete ECS operation at least every 24 hours and record the number of errors.

It is further to be noted that, in this embodiment of the present disclosure, the counting statistical circuit may include a threshold counting circuit, a density counting circuit, and a target counting circuit. The threshold counting circuit may be the counting circuit 30 of any one of the foregoing embodiments.

It is to be understood that, in some embodiments, the threshold counting circuit includes a first decoding module and a first counting module. Correspondingly, the method may further include the following operations.

The first decoding module receives a first mode signal, and decodes the first mode signal to generate a decoded signal.

A selected target counting module is determined according to the decoded signal from the at least one counting sub-module in the first counting module, the counting signal is received, the target counting module counts the counting signal, and outputs a first counting pulse signal every time when a counting value corresponding to the counting signals reaches an integer multiple of a counting threshold.

In the embodiment of the present disclosure, the number of bits of the decoded signal is $2^x$, where x represents the number of bits of the first mode signal. In addition, the first mode signal here represents the counting threshold.

In the embodiment of the present disclosure, the decoded signal includes N-bits decoded sub-signals, where N is an integer greater than 0. Correspondingly, for the first decoding module, in some embodiments, the method may further include the following operation.

During the generation of the decoded signal, in a case that a level value of an i-th-bit decoded sub-signal is a first value, it is determined that level values of other-bits decoded sub-signals other than the i-th-bit decoded sub-signal are all the second value. The first value is different from the second value, different values of i correspond to different decoded signals, different decoded signals represent different counting thresholds, and i is an integer greater than 0 and less than or equal to N.

In the embodiment of the present disclosure, the number of the at least one counting sub-module is N, and the at least one counting sub-module is cascaded. There is a correspondence relationship between an i-th counting sub-module and the i-th-bit decoded sub-signal. Correspondingly, for the first counting module, in some embodiments, the method may further include the following operations.

When the level value of the i-th-bit decoded sub-signal is the first value, it is determined that the i-th counting sub-module to an Nth counting sub-module are the target counting modules; and the counting signal is counted through the i-th counting sub-module to the Nth counting sub-module, and the first counting pulse signal is output.

In some embodiments, each counting sub-module includes a first input end, a second input end, and an output end. The first input end of each counting sub-module is connected with the counting signal. A second input end of a first counting sub-module is connected with a first power supply signal, a second input end of a j-th counting sub-module is connected with an output end of a (j−1)th counting sub-module, and an output end of the Nth counting sub-module is configured to output the first counting pulse signal, where j is an integer greater than 1 and less than or equal to N.

Further, in some embodiments, the i-th counting sub-module includes an i-th MUX and an i-th counting unit. A first input end of the i-th MUX is used as a first input end of the i-th counting sub-module to receive the counting signal, a second input end of the i-th MUX is used as a second input end of the i-th counting sub-module to receive a first input signal, and an output end of the i-th MUX is connected with a clock end of the i-th counting unit; and an output end of the i-th counting unit is used as an output end of the i-th counting sub-module to output an i-th intermediate signal. Correspondingly, the method may further include the following operations.

The i-th MUX receives the i-th-bit decoded sub-signal, and selects from the counting signal and the first input signal according to the i-th-bit decoded sub-signal to outputs an i-th selection signal.

The i-th counting unit receives the i-th selection signal and performs counting, and output the i-th intermediate signal.

Here, when i is equal to 1, the first input signal is the first power supply signal. When i is greater than 1 and less than or equal to N, the first input signal is an (i−1)th intermediate signal outputted by an (i−1)th counting unit; and when i is equal to N, an Nth intermediate signal is the first counting pulse signal.

Further, in some embodiments, the i-th counting unit may be an asynchronous binary counter. The asynchronous binary counter includes a plurality of first flip-flops cascaded in sequence. An input end of the first flip-flop of each stage is connected with a second output end of the first flip-flop itself, and the second output end of the first flip-flop of each stage is connected with a clock end of the next stage first flip-flop; a clock end of a first-stage first flip-flop is connected with the output end of the i-th MUX; and a second output end of the last stage first flip-flop is used as the output end of the i-th counting unit to output the i-th intermediate signal.

Further, in some embodiments, the method may further include the following operation. The counting signal generation module receives a second mode signal, and generates the counting signal in response to the second mode signal, herein the second mode signal indicates a target counting mode to be executed.

In the embodiment of the present disclosure, when a threshold counting circuit executes an ECS operation, the method may further include the following operations.

In a case that a level value of the second mode signal is a first value, it is determined that the target counting mode is a codeword counting mode, and the counting signal is a first counting signal.

Alternatively, in a case that the level value of the second mode signal is a second value, it is determined that the target counting mode is a row counting mode, and the counting signal is a second counting signal.

Further, in the embodiment of the present disclosure, the counting signal generation module may include an error detection module and a mode selection module. Correspondingly, in some embodiments, the method may further include the following operations.

On the basis of the error detection module, a first detection signal is generated according to a detected codeword error, the first detection signal is sent to the mode selection module; and a second detection signal is generated according to a detected row with a codeword error, and the second detection signal is sent to the mode selection module.

The mode selection module receives a second mode selection signal, the first detection signal and the second detection signal, and in response to the control of the second mode signal, generates the first counting signal according to the first detection signal, or the second counting signal is generated according to the second detection signal.

In some other embodiments, the method may further include the following operations.

The error detection module a second mode selection signal; and in response to the second mode selection signal, detects a codeword error in the codeword counting mode, generates a first detection signal according to the detected codeword error, and sends the first detection signal to the mode selection module; or detects a row with codeword error in a row counting mode, generates a second detection signal according to the detected rows with codeword error, and sends the second detection signal to the mode selection module.

The mode selection module receives the first detection signal or the second detection signal, and generates the first counting signal according to the first detection signal, or generates the second counting signal according to the second detection signal.

It is further to be understood that, in some embodiments, the storage density counting circuit may be an asynchronous binary counter. The asynchronous binary counter includes a plurality of second flip-flops cascaded in sequence. An input end of the second flip-flop of each stage is connected with a second output end of the second flip-flop, and the second output end of the second flip-flop of each stage is connected with a clock end of the next stage second flip-flop; a clock end of a first-stage second flip-flop is connected with an output end of the threshold counting circuit; and a second output end of the last stage second flip-flop is used as an output end of the storage density counting circuit to be connected with a clock end of the target counting circuit.

In the embodiment of the present disclosure, there is an association relationship between the number of the second flip-flops and the preset storage density, herein the preset storage density is d, the number of the second flip-flops is y, and $d=2^y$.

It is further to be understood that, in some embodiments, the target counting circuit may be an asynchronous binary counter. The asynchronous binary counter includes a plurality of third flip-flops cascaded in sequence. An input end of the third flip-flop of each stage is connected with a second output end of the third flip-flop, and the second output end of the third flip-flop of each stage is connected with a clock end of the next stage third flip-flop; a clock end of a first-stage third flip-flop is connected with an output end of the storage density counting circuit.

In the embodiment of the present disclosure, the number of the third flip-flops is M, and the target counting signal is a binary number including a 0th-bit target counting sub-signal to an (M−1)th-bit target counting sub-signal. A first output end of a (k+1)th-stage third flip-flop is configured to output a k-th-bit target counting sub-signal, where k is an integer greater than or equal to 0 and less than M.

Further, in some embodiments, the method may further include following operations. The second decoding module decodes the target counting signal according to a received ECS ending signal, and stores in a preset MR.

Further, in some embodiments, the MR includes at least M bits, and each bit corresponds to a preset counting range. Correspondingly, for the second decoding module, the method may further include: when a target counting result meets a k-th preset counting range, setting a value stored in a k-th-bit of the preset MR to a first value, and setting values stored in other bits other than the k-th-bit to a second value. The target counting result is a product of the counting value represented by the target counting signal and the preset value, and the preset value is a product value of the counting threshold and the preset storage density.

In the embodiment of the present disclosure, the minimum value of the k-th preset counting range is set to be a product of the preset value and $2^k$; and the maximum value of the k-th preset counting range is set to be a difference between the product of the preset value and the $2^{k+1}$ and 1.

An embodiment of the present disclosure provides a counting method, which is applied to the semiconductor memory described in the foregoing embodiments. In the semiconductor memory, different decoded signals may indicate different counting threshold levels, and different target counting modules can be selected according to different decoded signals, such that error counting statistics for different counting threshold levels can be met. The problem of excessive connecting wires caused by a large number of logic devices used in the related art may also be avoided by adaptively selecting the target counting module according to different decoded signals, and circuit areas and the number of the connecting wires can also be reduced, such that the complexity of a circuit is reduced. In addition, according to the preset counting range for which the final error counting result is met, a corresponding bit of the preset MR may be set to 1, such that the error counting result can be loaded in the preset MR according to requirements, thereby improving the performance of a memory.

The above descriptions are merely preferred embodiments of the disclosure, and are not intended to limit the protection scope of the present disclosure.

It is to be noted that terms "include" and "comprise" or any other variant thereof is intended to cover nonexclusive inclusions herein, such that a process, a method, an object or an apparatus including a series of components not only includes those components but also includes other components which are not clearly listed or further includes components intrinsic to the process, the method, the object or the apparatus. Under the condition of no more limitations, a component defined by the statement "including a/an . . . " does not exclude existence of the same other components in a process, method, object or apparatus including the component.

The serial numbers of the foregoing embodiments of the present disclosure are merely for description, and do not represent the superiority or inferiority of the embodiments.

The methods disclosed in several method embodiments provided by the present disclosure can be combined arbitrarily without conflict to obtain a new method embodiment.

The characteristics disclosed in several product embodiments provided in the present disclosure can be combined arbitrarily without conflict to obtain a new product embodiment.

The characteristics disclosed in several method or circuit embodiments provided in the present disclosure can be combined arbitrarily without conflict to obtain a new method embodiment or device embodiment.

The above is only the specific implementations of the present disclosure and not intended to limit the scope of protection of the present disclosure. Any variations or replacements apparent to those skilled in the art within the technical scope disclosed by the present disclosure shall fall within the scope of protection of the present disclosure. Therefore, the protection scope of the present disclosure shall be subject to the protection scope of the claims.

INDUSTRIAL APPLICABILITY

According to the counting circuit, the semiconductor memory, and the counting method provided in the embodiments of the present disclosure, the counting circuit includes the first decoding module and the first counting module, and the first decoding module is connected with the first counting module. The first decoding module is configured to receive the first mode signal, and decode the first mode signal to generate the decoded signal; and the first counting module includes at least one counting sub-module, and is configured to: determine, according to the decoded signal, the selected target counting module from the at least one counting sub-module, receive a counting signal, count the counting signal through the target counting module, and output the first counting pulse signal every time when the counting value corresponding to the counting signal reaches an integer multiple of the counting threshold. In this way, the decoded signal may be generated according to first mode signal, different decoded signals may indicate different counting threshold levels, and different target counting modules can be selected according to different decoded signals, such that counting statistics for different counting threshold levels can be met. In addition, the problem of excessive connecting wires caused by a large number of logic devices used in the related art may also be avoided by adaptively selecting the target counting module according to different decoded signals, and circuit areas and the number of the connecting wires can also be reduced, such that the complexity of a circuit is reduced, thereby improving the performance of a memory.

The invention claimed is:

1. A counting circuit, comprising a first decoding circuit and a first counting circuit, wherein the first decoding circuit is connected with the first counting circuit;

the first decoding circuit is configured to receive a first mode signal, and decode the first mode signal to generate a decoded signal; and the first counting circuit comprises at least one counting sub-circuit, and is configured to: determine, according to the decoded signal, a selected target counting circuit from the at least one counting sub-circuit, receive a counting signal, count the counting signal through the target counting circuit, and output a first counting pulse signal every time when a counting value corresponding to the counting signal reaches an integer multiple of a counting threshold;

wherein the decoded signal comprises N-bits decoded sub-signals, wherein N is an integer greater than 0; and the first decoding circuit is further configured to: during a generation of the decoded signal, in a case that a level value of an i-th-bit decoded sub-signal is a first value, determine that all level values of other-bits decoded sub-signals other than the i-th-bit decoded sub-signal are a second value, wherein the first value is different from the second value, different values of i correspond to different decoded signals, different decoded signals represent different counting thresholds, and i is an integer greater than 0 and less than or equal to N;

wherein a number of the at least one counting sub-circuit is N, and the at least one counting sub-circuit is cascaded; there is a correspondence relationship between an i-th counting sub-circuit and the i-th-bit decoded sub-signal; and the first counting circuit is configured to: when the level value of the i-th-bit decoded sub-signal is the first value, determine that the i-th counting sub-circuit to an Nth counting sub-circuit are target counting circuits; and count the counting signal through the i-th counting sub-circuit to the Nth counting sub-circuit, and output the first counting pulse signal.

2. The counting circuit of claim 1, wherein the first mode signal represents the counting threshold.

3. The counting circuit of claim 1, wherein each counting sub-circuit comprises a first input end, a second input end, and an output end;

the first input end of each counting sub-circuit is connected with the counting signal; and a second input end of a first counting sub-circuit is connected with a first power supply signal, a second input end of a j-th counting sub-circuit is connected with an output end of a (j−1)th counting sub-circuit, and an output end of the Nth counting sub-circuit is configured to output the first counting pulse signal, wherein j is an integer greater than 1 and less than or equal to N.

4. The counting circuit of claim 3, wherein the i-th counting sub-circuit comprises an i-th Multiplexer (MUX) and an i-th counting sub-subcircuit; a first input end of the i-th MUX is used as a first input end of the i-th counting sub-circuit to receive the counting signal, a second input end of the i-th MUX is used as a second input end of the i-th counting sub-circuit to receive a first input signal, and an output end of the i-th MUX is connected with a clock end of the i-th counting sub-subcircuit; an output end of the i-th counting sub-subcircuit is used as an output end of the i-th counting sub-circuit to output an i-th intermediate signal;

the i-th MUX is configured to receive the i-th-bit decoded sub-signal, and select from the counting signal and the first input signal according to the i-th-bit decoded sub-signal and output an i-th selection signal;

the i-th counting sub-subcircuit is configured to receive the i-th selection signal and perform counting, and output the i-th intermediate signal; and when i is equal to 1, the first input signal is the first power supply signal; when i is greater than 1 and less than or equal to N, the first input signal is an (i−1)th intermediate signal outputted by an (i−1)th counting sub-subcircuit; and when i is equal to N, an Nth intermediate signal is the first counting pulse signal.

5. The counting circuit of claim 4, wherein the i-th counting sub-subcircuit is an asynchronous binary counter; and the asynchronous binary counter comprises a plurality of first flip-flops cascaded in sequence, wherein an input end of a first flip-flop of each stage is connected with a second output end of the first flip-flop, and the second output end of the first flip-flop of each stage is connected with a clock end of a next stage first flip-flop; a clock end of a first-stage first flip-flop is connected with the output end of the i-th MUX; and a second output end of a last stage first flip-flop is used as the output end of the i-th counting sub-subcircuit to output the i-th intermediate signal.

6. The counting circuit of claim 1, further comprising a counting signal generation circuit; and, wherein the counting signal generation circuit is configured to receive a second mode signal, and generate the counting signal in response to the second mode signal, and wherein the second mode signal indicates a target counting mode to be executed.

7. The counting circuit of claim 6, wherein when the counting circuit executes an Error Check and Scrub (ECS) operation, when a level value of the second mode signal is a first value, it is determined that the target counting mode is a codeword counting mode, and the counting signal is a first counting signal; or when the level value of the second mode signal is a second value, it is determined that the target counting mode is a row counting mode, and the counting signal is a second counting signal.

8. The counting circuit of claim 7, wherein the counting signal generation circuit comprises an error detection circuit and a mode selection circuit;

the error detection circuit is configured to: generate a first detection signal according to a detected codeword error, send the first detection signal to the mode selection circuit; and generate a second detection signal according to a detected row with a codeword error, and send the second detection signal to the mode selection circuit; and the mode selection circuit is connected with the error detection circuit, and is configured to: receive a second mode selection signal, the first detection signal and the second detection signal; and in response to a control of the second mode signal, generate the first counting signal according to the first detection signal, or generate the second counting signal according to the second detection signal.

9. The counting circuit of claim 7, wherein the counting signal generation circuit comprises an error detection circuit and a mode selection circuit;

the error detection circuit is configured to: receive a second mode selection signal; and in response to the second mode selection signal, detect a codeword error in the codeword counting mode, generate a first detection signal according to the detected codeword error, and send the first detection signal to the mode selection circuit; or detect a row with codeword error in the row counting mode, generate a second detection signal according to the detected row with codeword error, and send the second detection signal to the mode selection circuit; and the mode selection circuit is connected with the error detection circuit, and is configured to receive the first detection signal or the second detection signal, and generate the first counting signal according to the first detection signal, or generate the second counting signal according to the second detection signal.

10. The counting circuit of claim 1, wherein a number of bits of the decoded signal is $2^x$, and x represents a number of bits of the first mode signal.

11. A semiconductor memory, comprising a threshold counting circuit, a storage density counting circuit and a target counting circuit, wherein the threshold counting circuit is the counting circuit of claim 1;

the threshold counting circuit is configured to receive a counting signal, count the counting signal by an internal target counting circuit, and output a first counting pulse signal every time when a counting value corresponding to the counting signal reaches an integer multiple of a counting threshold;

the storage density counting circuit is configured to count the first counting pulse signal, and output a second counting pulse signal every time when a counting value corresponding to the first counting pulse signal reaches an integer multiple of a preset storage density; and the target counting circuit is configured to count the second counting pulse signal, and output a target counting signal.

12. The semiconductor memory of claim 11, wherein the storage density counting circuit is an asynchronous binary counter; and the asynchronous binary counter comprises a plurality of second flip-flops cascaded in sequence, wherein an input end of a second flip-flop of each stage is connected with a second output end of the second flip-flop, and the second output end of the second flip-flop of each stage is connected with a clock end of a next stage second flip-flop; a clock end of a first-stage second flip-flop is connected with an output end of the threshold counting circuit; and a second output end of a last stage second flip-flop is used as an output end of the storage density counting circuit to be connected with a clock end of the target counting circuit.

13. The semiconductor memory of claim 12, wherein there is an association relationship between a number of the second flip-flops and the preset storage density, and wherein the preset storage density is d, the number of the second flip-flops is y, and $d=2^y$.

14. The semiconductor memory of claim 11, wherein the target counting circuit is an asynchronous binary counter; and the asynchronous binary counter comprises a plurality of third flip-flops cascaded in sequence, wherein an input end of a third flip-flop of each stage is connected with a second output end of the third flip-flop, and the second output end of the third flip-flop of each stage is connected with a clock end of a next stage third flip-flop; a clock end of a first-stage third flip-flop is connected with an output end of the storage density counting circuit.

15. The semiconductor memory of claim 14, wherein a number of the third flip-flops is M, and the target counting signal is a binary number comprising a 0th-bit target counting sub-signal to an (M−1)th-bit target counting sub-signal; and a first output end of a (k+1)th-stage third flip-flop is configured to output a k-th-bit target counting sub-signal, wherein k is an integer greater than or equal to 0 and less than M.

16. The semiconductor memory of claim 11, further comprising a second decoding circuit, wherein the second decoding circuit is configured to decode the target counting signal according to a received Error Check and Scrub (ECS) ending signal, and store in a preset Mode Register (MR).

17. The semiconductor memory of claim 16, wherein the preset MR comprises at least M bits, and each bit corresponds to a preset counting range; and the second decoding circuit is further configured to, when a target counting result meets a k-th preset counting range, set a value stored in a k-th-bit of the preset MR to a first value, and set values stored in other bits other than the k-th-bit to a second value; and wherein the target counting result is a product of a counting value represented by the target counting signal and a preset value, and the preset value is a product value of the counting threshold and the preset storage density;

a minimum value of the k-th preset counting range is set to be a product of the preset value and $2^k$; and a maximum value of the k-th preset counting range is set to be a difference between a product of the preset value and the $2^{k+1}$ and 1.

18. A counting method, applied to the semiconductor memory of claim 11, comprising:

receiving a counting signal; counting, by a target counting circuit in a threshold counting circuit, the counting signal; and outputting, by the target counting circuit in a threshold counting circuit, a first counting pulse signal every time when a counting value corresponding to the counting signal reaches an integer multiple of a counting threshold;

counting, by a density counting circuit, the first counting pulse signal; and outputting, by the density counting circuit, a second counting pulse signal every time when a counting value corresponding to the first counting pulse signal reaches an integer multiple of a preset storage density; and counting, by a target counting circuit, the second counting pulse signal; and outputting, by the target counting circuit, a target counting signal.

19. A semiconductor memory, comprising a threshold counting circuit, a storage density counting circuit and a target counting circuit;

wherein the threshold counting circuit comprising a first decoding circuit and a first counting circuit, wherein the first decoding circuit is connected with the first counting circuit;

the first decoding circuit is configured to receive a first mode signal, and decode the first mode signal to generate a decoded signal; and the first counting circuit comprises at least one counting sub-circuit, and is configured to: determine, according to the decoded signal, a selected target counting circuit from the at least one counting sub-circuit, receive a counting signal, count the counting signal through the target counting circuit, and output a first counting pulse signal every time when a counting value corresponding to the counting signal reaches an integer multiple of a counting threshold;

the threshold counting circuit is configured to receive a counting signal, count the counting signal by an internal target counting circuit, and output a first counting pulse signal every time when a counting value corresponding to the counting signal reaches an integer multiple of a counting threshold;

the storage density counting circuit is configured to count the first counting pulse signal, and output a second counting pulse signal every time when a counting value corresponding to the first counting pulse signal reaches an integer multiple of a preset storage density; and the target counting circuit is configured to count the second counting pulse signal, and output a target counting signal.

* * * * *